United States Patent [19]
Asai et al.

[11] Patent Number: 5,688,583
[45] Date of Patent: Nov. 18, 1997

[54] ADHESIVE FOR PRINTED CIRCUIT BOARD

[75] Inventors: Motoo Asai; Chie Onishi, both of Gifu, Japan

[73] Assignee: Ibiden Co., Ltd., Gifu, Japan

[21] Appl. No.: 466,616

[22] Filed: Jun. 6, 1995

Related U.S. Application Data

[62] Division of Ser. No. 248,209, May 24, 1994, Pat. No. 5,447,996, which is a division of Ser. No. 913,935, Jul. 17, 1992, Pat. No. 5,344,893.

[30] Foreign Application Priority Data

Jul. 23, 1991 [JP] Japan .................... 3-205618

[51] Int. Cl.$^6$ ............................. B32B 3/00; B32B 7/06; C08F 283/00; C09J 161/20
[52] U.S. Cl. .................. 428/200; 428/206; 428/261; 525/510; 525/518; 525/934; 525/935
[58] Field of Search ..................... 525/509, 510, 525/518, 519, 934, 935; 528/230, 246, 250, 211; 428/200, 206, 261

[56] References Cited

U.S. PATENT DOCUMENTS

| | | | |
|---|---|---|---|
| 3,989,767 | 11/1976 | Homma et al. | 260/834 |
| 3,993,549 | 11/1976 | Bush et al. | 522/78 |
| 4,093,674 | 6/1978 | Tsutsui et al. | 260/830 P |
| 4,151,220 | 4/1979 | Watanbe et al. | 260/850 |
| 4,152,477 | 5/1979 | Haruta et al. | 428/209 |
| 4,496,415 | 1/1985 | Sprengling | 156/283 |
| 4,504,607 | 3/1985 | Leech | 523/427 |
| 4,752,499 | 6/1988 | Enomoto | 427/98 |
| 5,021,472 | 6/1991 | Enomoto | 523/427 |
| 5,039,762 | 8/1991 | Demary | 525/509 |
| 5,055,321 | 10/1991 | Enomoto | 427/98 |
| 5,106,937 | 4/1992 | Yamaya et al. | 528/170 |
| 5,106,945 | 4/1992 | Hare | 528/332 |
| 5,137,936 | 8/1992 | Akiguchi et al. | 522/170 |

FOREIGN PATENT DOCUMENTS

| | | |
|---|---|---|
| 51-96872 | 8/1976 | Japan . |
| 53-140344 | 12/1978 | Japan . |
| 61-276875 | 12/1986 | Japan . |
| 63-126297 | 5/1988 | Japan . |
| 2182731 | 7/1990 | Japan . |
| 2188992 | 7/1990 | Japan . |

OTHER PUBLICATIONS

Moore, J.A., Editor, "Macromolecular Synthese", *Methods for the Preparation of Macromolecules*, Collective vol. 1, pp. 257–264, 1977.

"Resin Technique for Coating", Kogyo Chosakai Publishing Co., Ltd., p. 272, 1986.

*Primary Examiner*—Susan W. Berman
*Attorney, Agent, or Firm*—Greenblum & Bernstein P.L.C.

[57] ABSTRACT

There are disclosed an adhesive obtained by dispersing a cured amino resin fine powder soluble in acid or oxidizing agent into an uncured heat-resistant resin matrix hardly soluble in acid or oxidizing agent when being subjected to a curing treatment as well as a printed circuit board using this adhesive and a method of producing the same. The adhesive has excellent properties such as resistance to chemicals, heat resistance, electric properties, hardness and adhesion property owing to the use of the amino resin fine powder. Therefore, the printed circuit board using such an adhesive is not influenced by service circumstance and is high in the connection reliability without forming short circuit between patterns. Furthermore, in the method of producing the printed circuit board, the adhesive is provided in form of a sheet or a prepreg, whereby the printed circuit board can be produced easily and cheaply.

14 Claims, 15 Drawing Sheets

FIG._1a 
FIG._1b 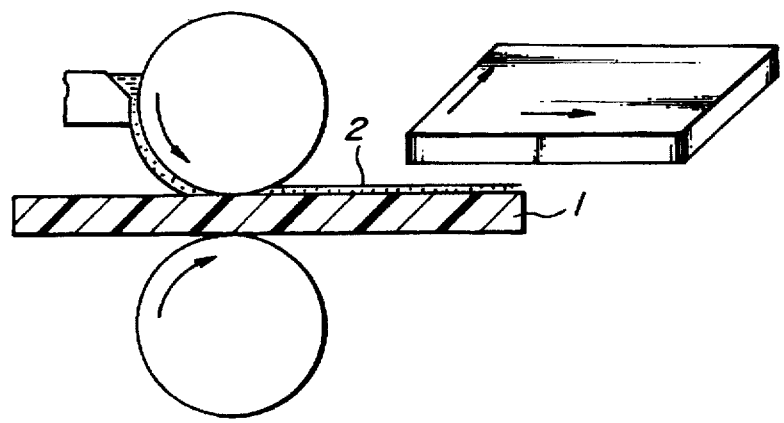
FIG._1c 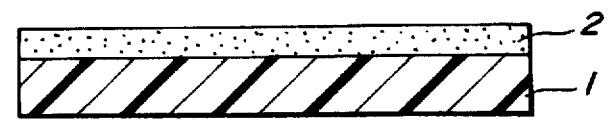
FIG._1d 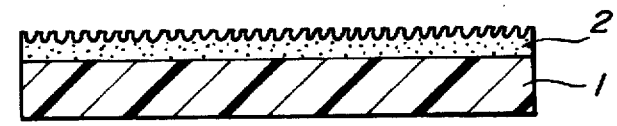
FIG._1e 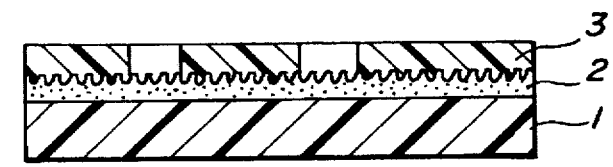
FIG._1f 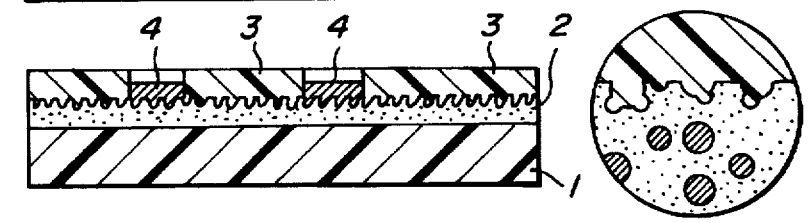
FIG. 1g

FIG._2a
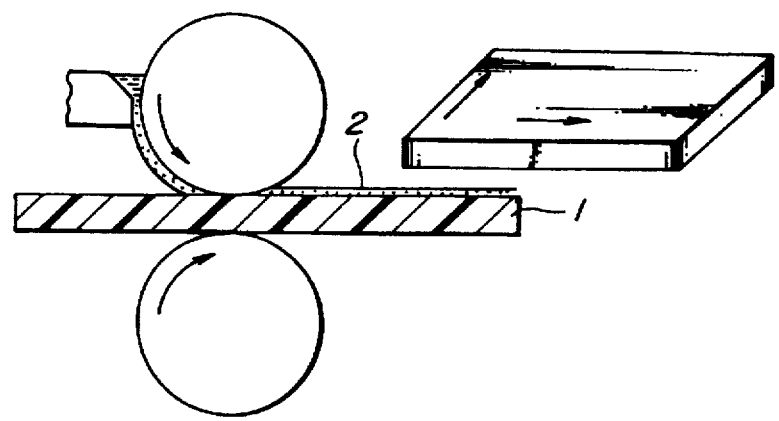
FIG._2b
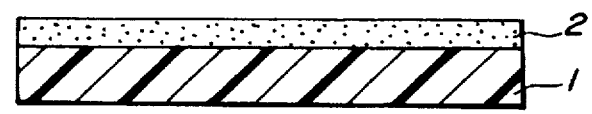
FIG._2c
FIG._2d
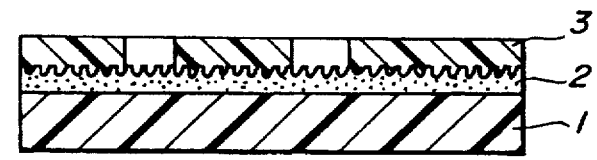
FIG._2e
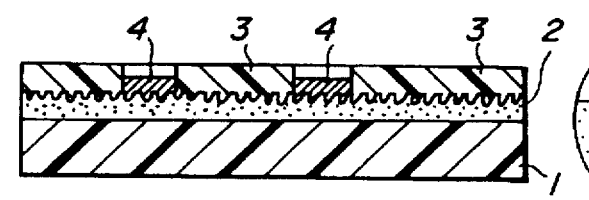
FIG._2f
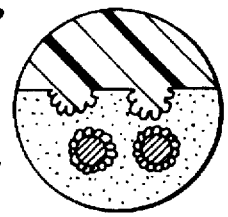
FIG._2g FIG._3a 
FIG._3b 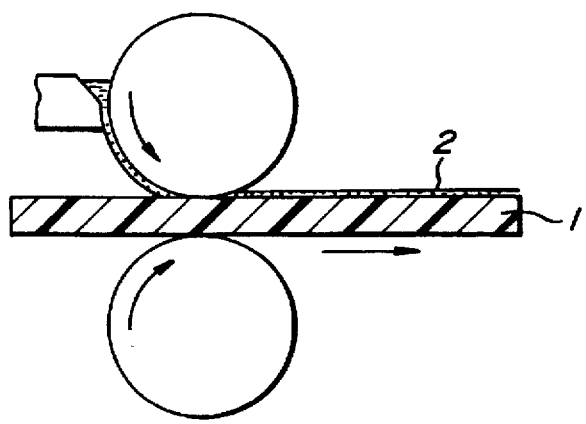
FIG._3c 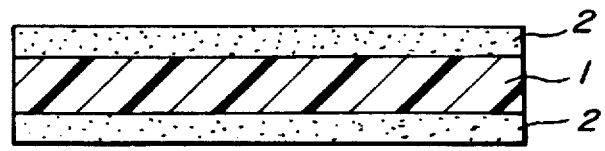
FIG._3d 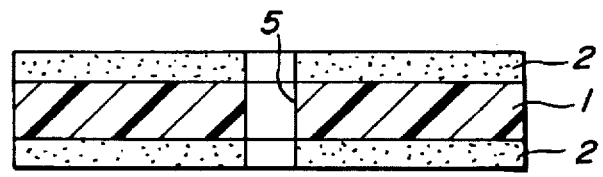
FIG._3e 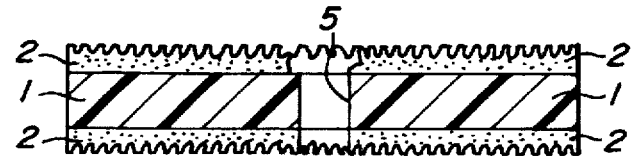
FIG._3f 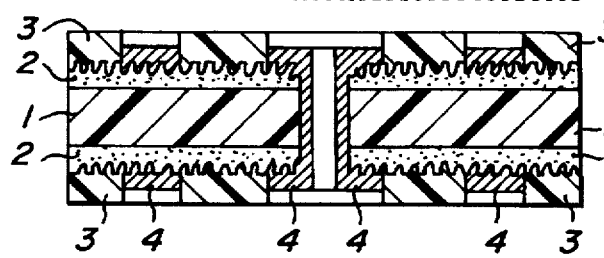
FIG._3g 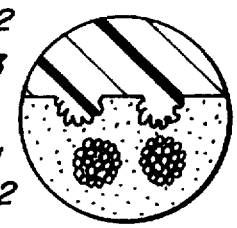

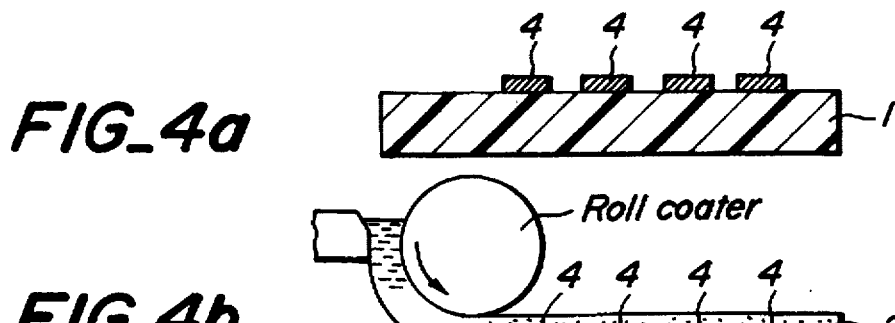
FIG_4a
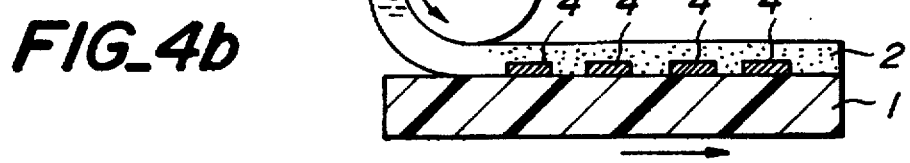
FIG_4b
FIG_4c
FIG_4d
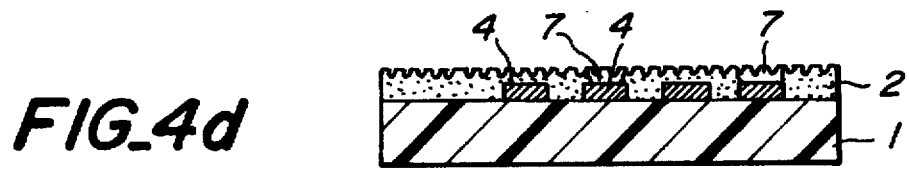
FIG_4e
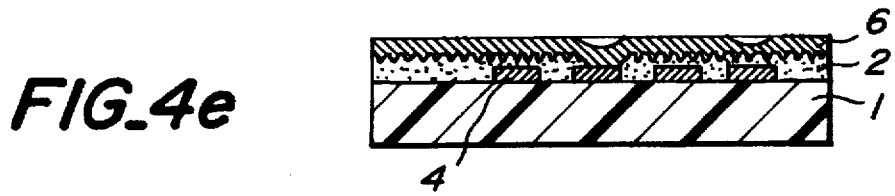
FIG_4f
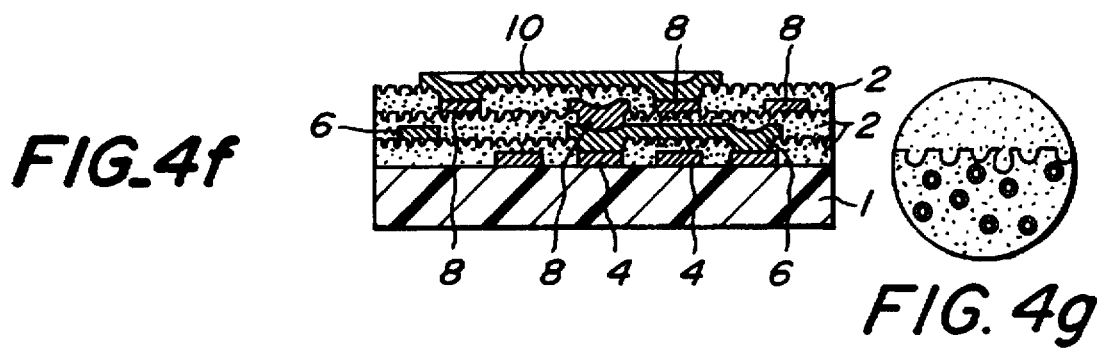
FIG. 4g

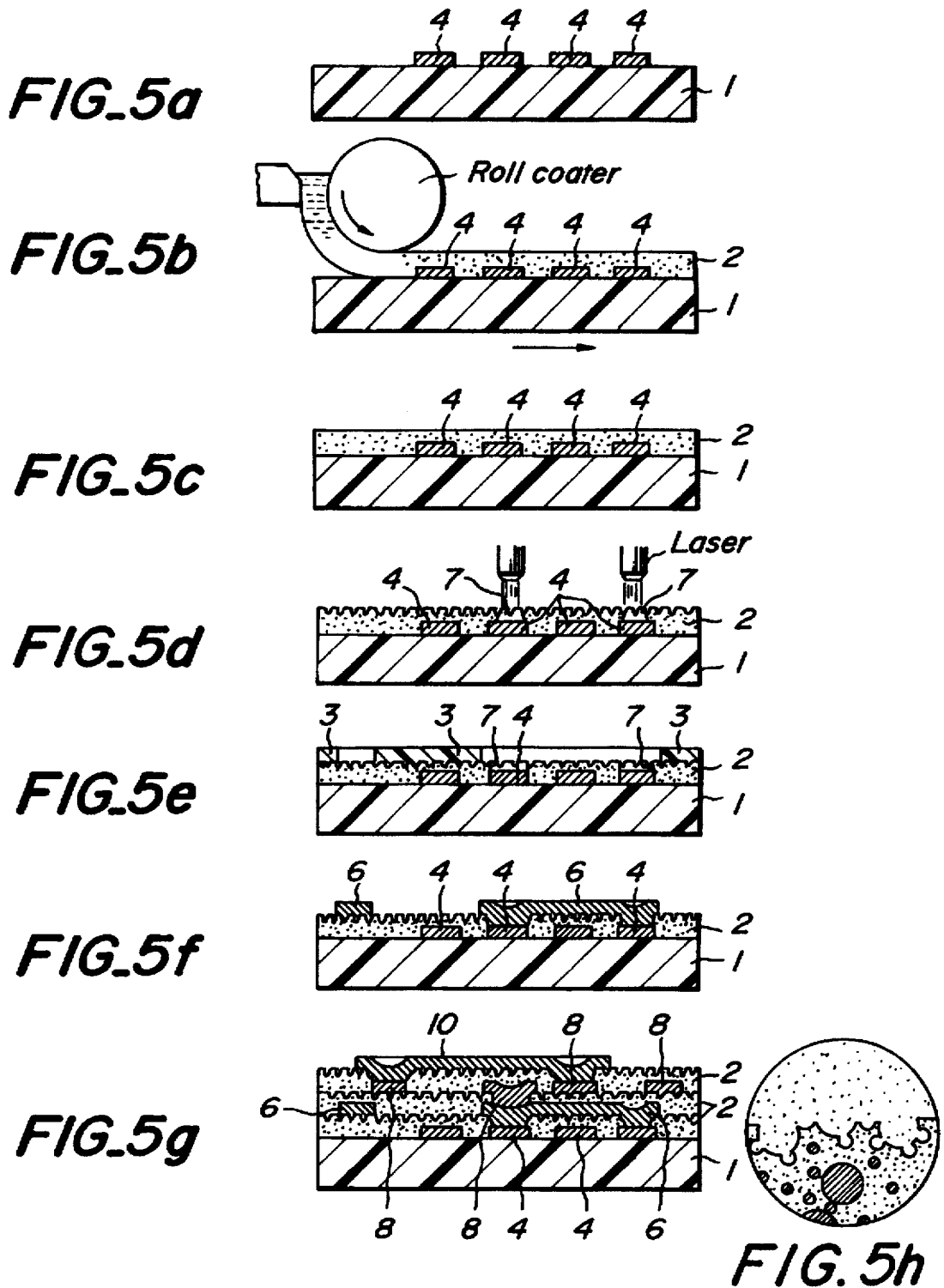

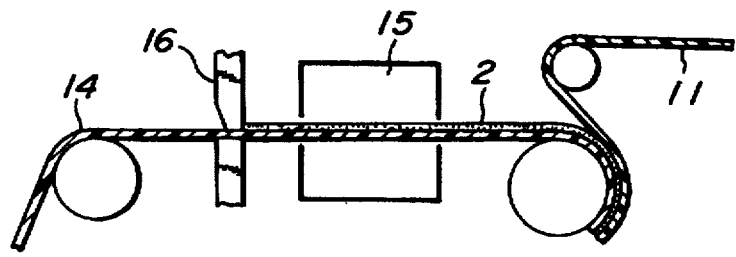
FIG._6a
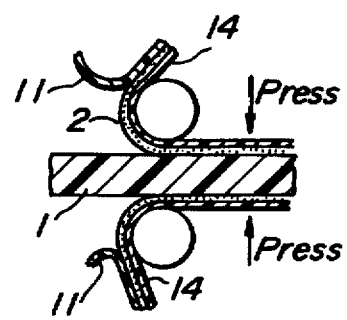
FIG._6b
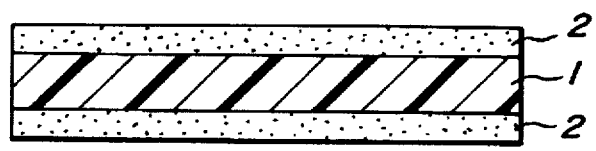
FIG._6c
FIG._6d
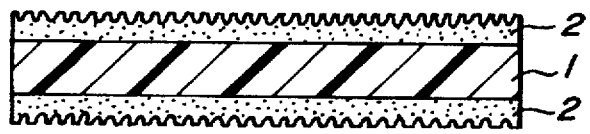
FIG._6e
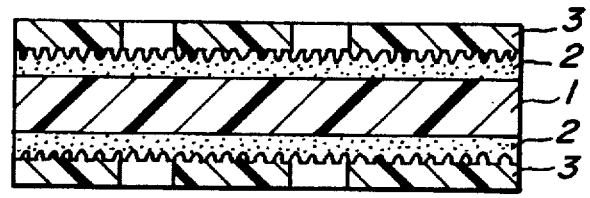
FIG._6f
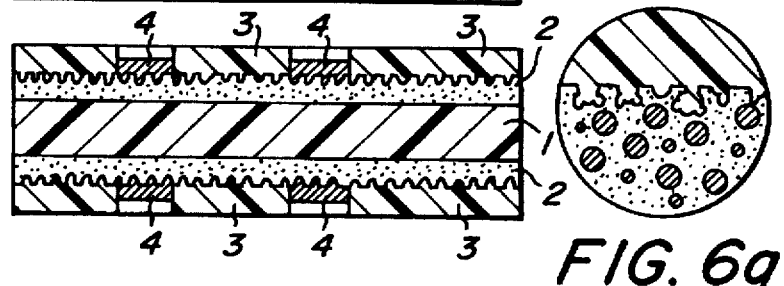
FIG. 6g

FIG. 7d

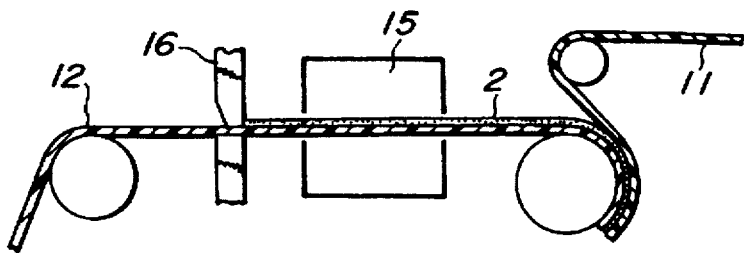
FIG._8a
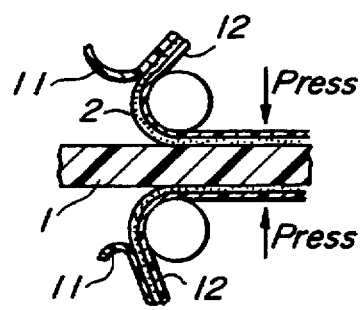
FIG._8b
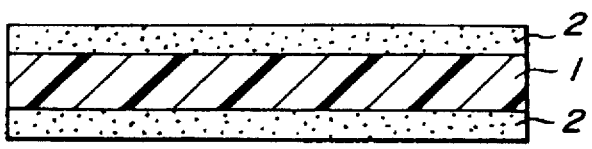
FIG._8c
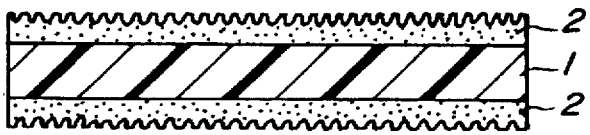
FIG._8d
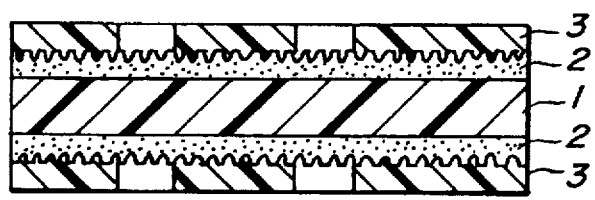
FIG._8e
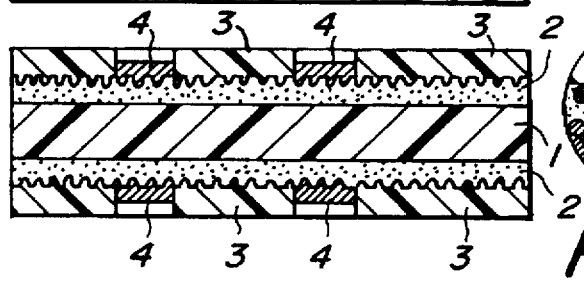
FIG._8f
FIG._8g

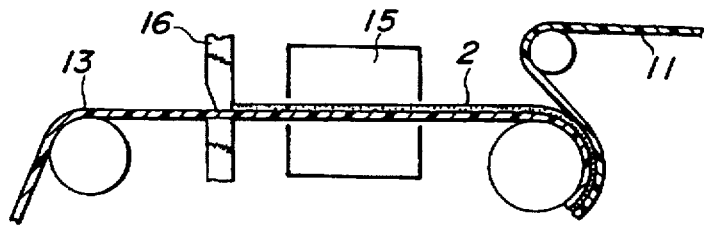
FIG_9a
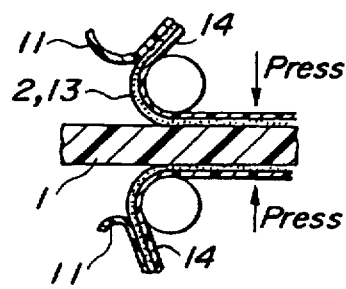
FIG_9b
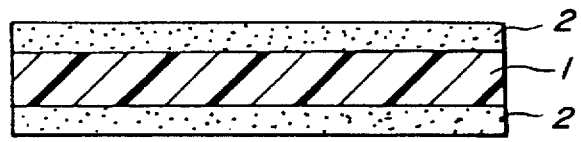
FIG_9c
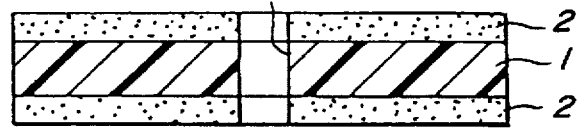
FIG_9d
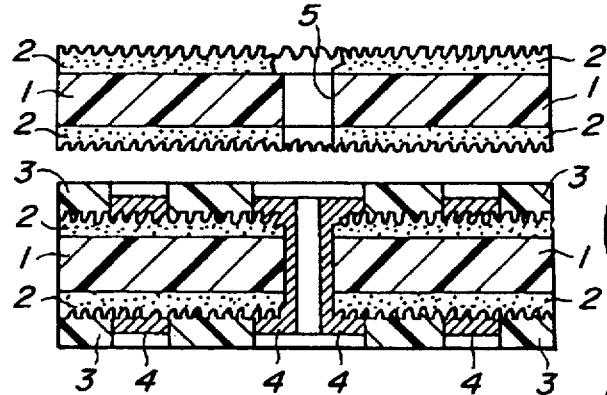
FIG_9e
FIG_9f
FIG_9g

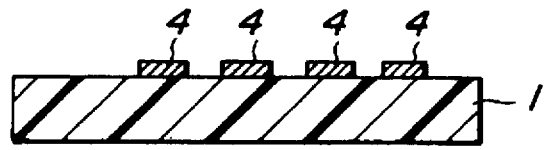
FIG_10a
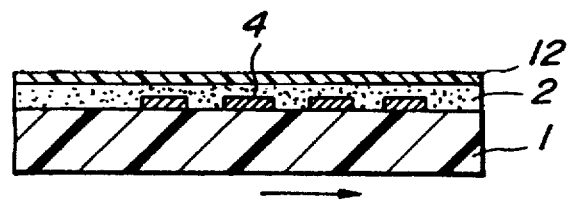
FIG_10b
FIG_10c
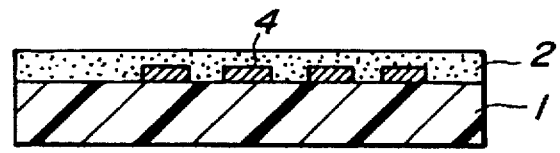
FIG_10d
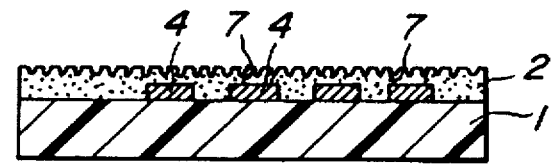
FIG_10e
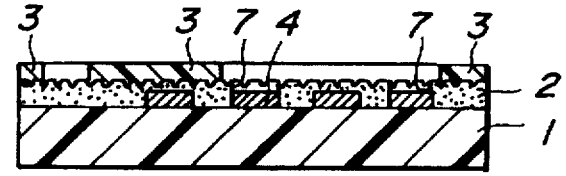
FIG_10f
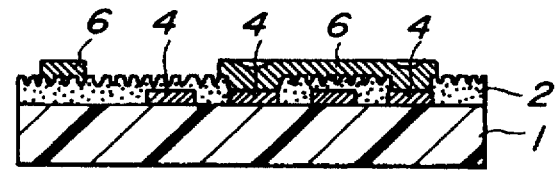
FIG_10g
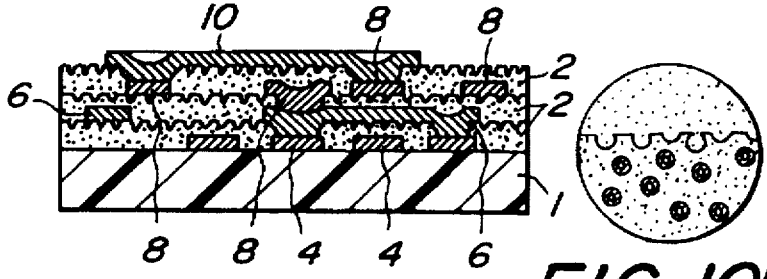
FIG. 10h

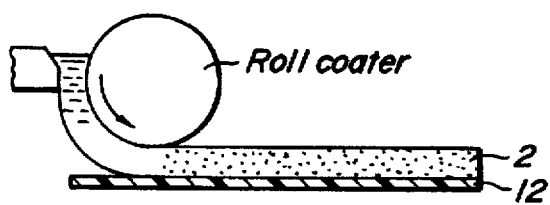
FIG_11a
FIG_11b
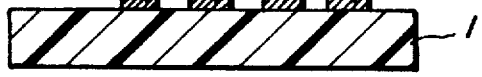
FIG_11c
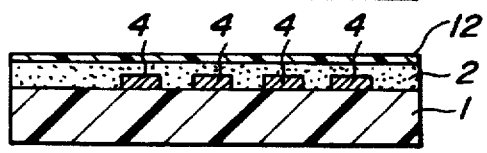
FIG_11d
FIG_11e
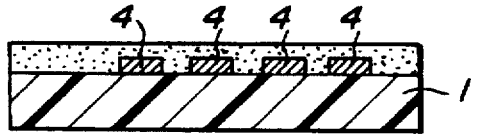
FIG_11f
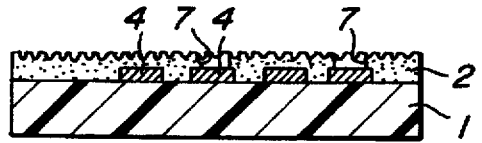
FIG_11g
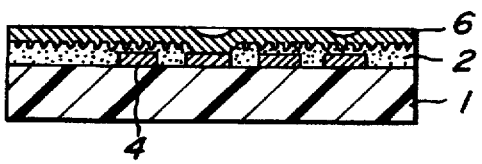
FIG_11h
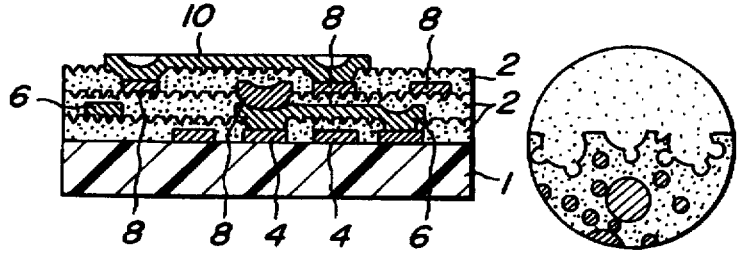
FIG_11i FIG_12a
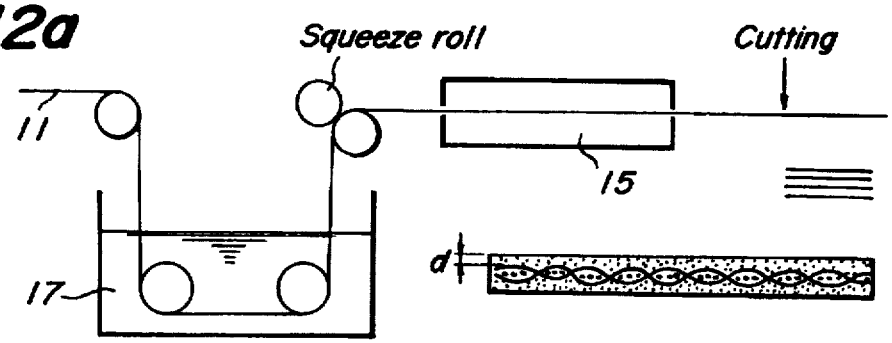
FIG_12b
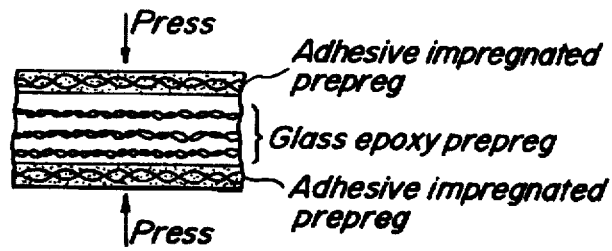
FIG_12c
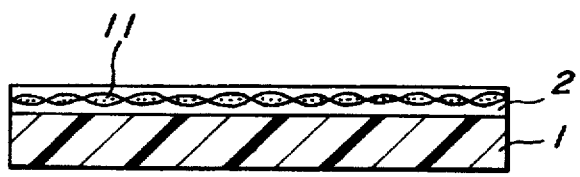
FIG_12d
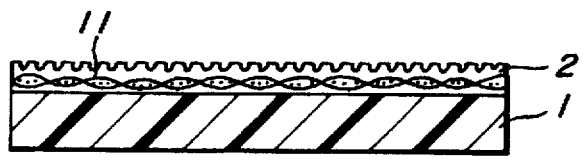
FIG_12e
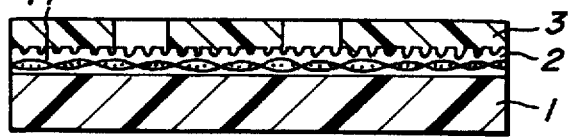
FIG_12f
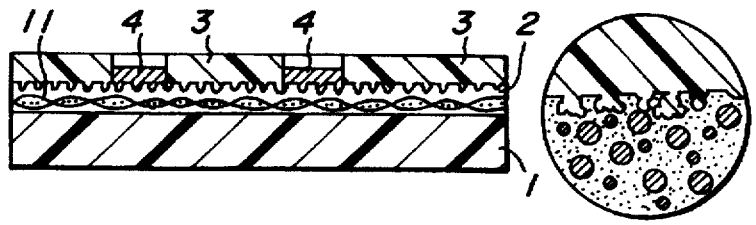
FIG. 12g

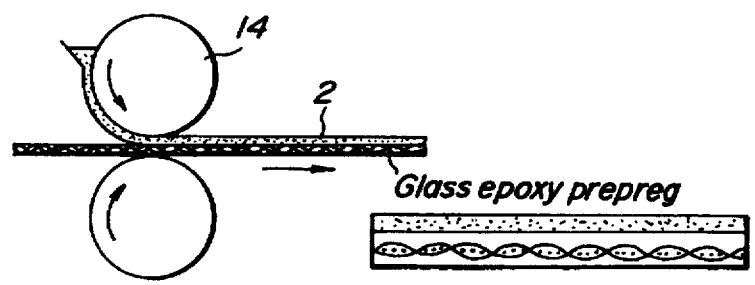
FIG._13a
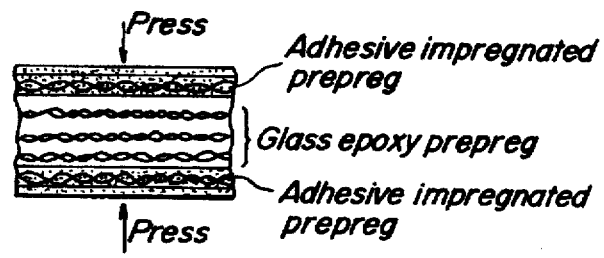
FIG._13b
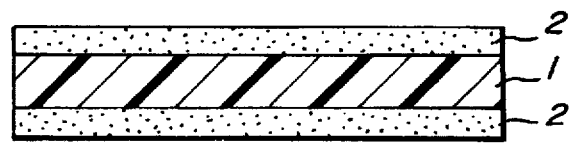
FIG._13c
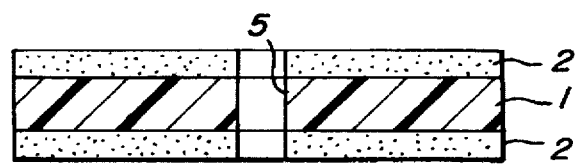
FIG._13d
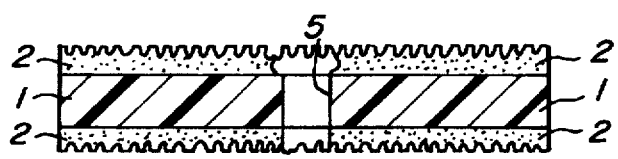
FIG._13e
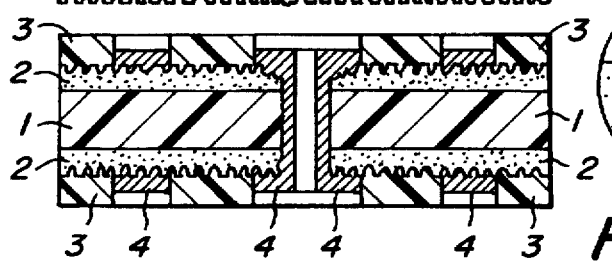
FIG._13f
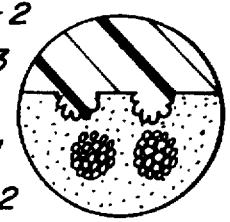
FIG. 13g

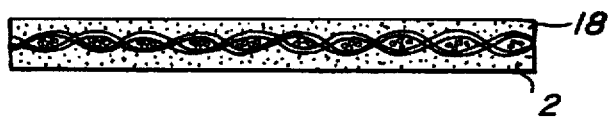
FIG._14a
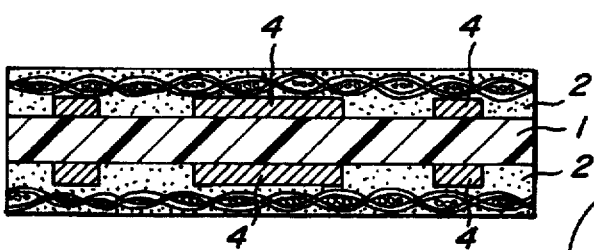
FIG._14b
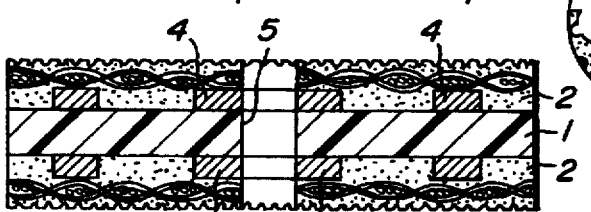
FIG._14c    FIG._14f
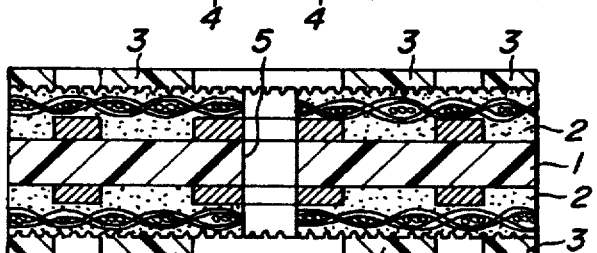
FIG._14d
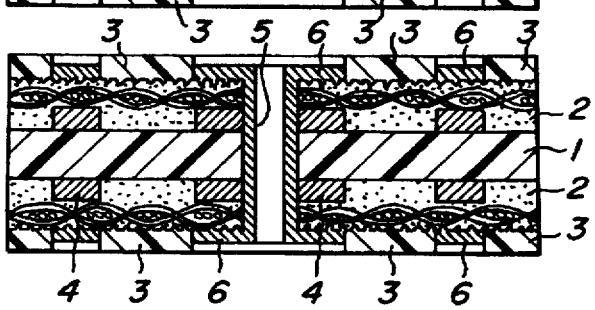
FIG._14e

FIG_15
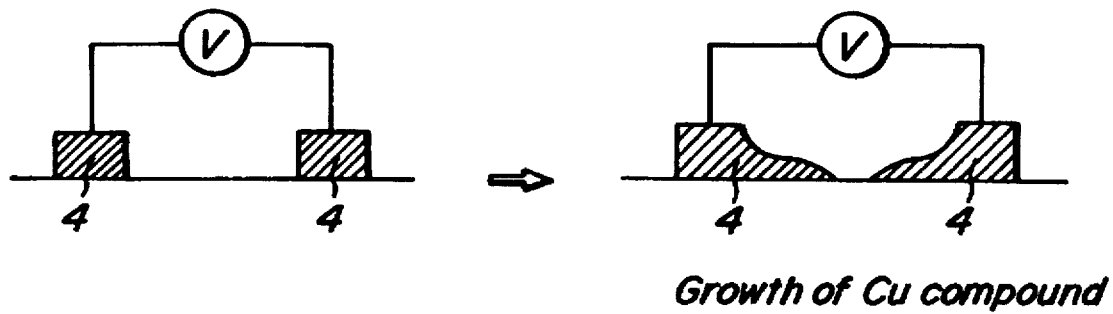
Growth of Cu compound

ADHESIVE FOR PRINTED CIRCUIT BOARD

This application is a division of application Ser. No. 08/248,209, filed May 24, 1994, now U.S. Pat. No. 5,447,996 which is a division of application Ser. No. 07/913,935, filed Jun. 17, 1992, now U.S. Pat. No. 5,344,893.

BACKGROUND OF THE INVENTION

1. Field of the invention

This invention relates to an adhesive for printed circuit board, a method of producing a printed circuit board by using the same and a printed circuit board, and more particularly to an adhesive having improved resistance to chemicals, heat resistance, electrical properties and adhesion property, a method of easily producing a printed circuit board by using such an adhesive and a printed circuit board having a high reliability.

2. Disclosure of the Related Art

Recently, high densification or high speed access of calculating function in electronic equipments such as large-size computer or the like is advanced with the progress of electronic technique. As a result, high densification and high reliability through fine pattern are lately required even in printed circuit board and LSI mounted print circuit board. Particularly, multi-layer printed circuit boards having a plurality of printed circuit layers are lately spotlighted in accordance with high densification and high-speed access.

In the production of the printed circuit board, there has hitherto been known a so-called etched foil method in which a copper foil is laminated onto a substrate and subjected to a photoetching to form a conductor circuit as a method for the formation of conductor circuit. According to this method, the conductor circuit having an excellent adhesion property to the substrate can be formed, but there is a serious drawback that it is difficult to obtain a fine pattern of a high accuracy by etching because the thickness of the copper foil is thick. Furthermore, the production steps become complicated and also the production efficiency is poor.

As a method of forming the conductor circuit onto the substrate, therefore, there has recently been adopted a so-called additive method wherein an adhesive including a diene series synthetic rubber is applied to the surface of the substrate to form an adhesive layer and then the surface of the adhesive layer is roughened and subjected to an electroless plating to form a conductor circuit.

However, the adhesive usually used in the latter method includes the synthetic rubber, so that the heat resistance is low because the adhesion strength is largely lowered at, for example, high temperature and the electroless plated film swells during the soldering, and the electric properties such as surface resistivity and the like are insufficient, and hence the use range is fairly restricted.

As a typical example of the multilayer printed circuit board, there is a system that plural circuit plates each provided with an internal circuit pattern are laminated with each other through a prepreg as an insulating layer and pressed and then a through-hole is formed therein to connect and electrically conduct the internal circuit patterns to each other.

In the multilayer printed circuit board of this system, the plural internal circuit patterns are connected and electrically conducted to each other through the through-hole, and the wiring circuit pattern becomes too complicated, so that it is difficult to realize the high densification or high speed access.

For this end, there are lately developed multilayer printed circuit boards, in which conductor circuit and organic insulating films are alternately built up on each other, as a multilayer printed circuit board capable of overcoming the above problem. Such a multilayer printed circuit board is certainly suitable for extra-high densification and high speed access.

However, it is actually difficult to form an electroless plated film on the organic insulating layer with a good reliability. In the multilayer printed circuit board, therefore, the conductor circuit is formed by PVD process such as vapor deposition, sputtering and the like, or by using electroless plating with the above PVD process. However, the formation of conductor circuit through PVD process is poor in the productivity and undesirably high in the cost.

On the other hand, the inventors have made various studies in order to solve the aforementioned problems produced in the above adhesives for electroless plating, and previously proposed an adhesive for electroless plating having improved heat resistance, electrical properties and adhesion property to the electroless plated film and capable of relatively easily utilizing it and a method of producing circuit boards by using the adhesive and printed circuit boards produced therefrom (Japanese Patent laid open No. 61-276875, No. 63-126297, No. 2-182731, No. 2-188992, and U.S. Pat. Nos. 4,752,499, 5,021,472 and 5,055,321).

That is, these techniques relate to an adhesive in which heat-resistant resin powder being soluble in an oxidizing agent and subjected to a curing treatment is dispersed into an uncured heat-resistant resin matrix being insoluble in the oxidizing agent through the curing treatment, and a method of producing printed circuit boards in which the above adhesive is applied to a substrate and dried and cured to form an adhesive layer, and thereafter at least a part of the above powder dispersed in the surface portion of the adhesive layer is dissolved and removed to roughen the surface of the adhesive layer, and then the thus treated substrate is subjected to an electroless plating as well as printed circuit boards produced by this method.

In the adhesive according to these techniques, the fine powder of the previously cured epoxy resin is dispersed into the heat-resistant resin matrix, so that when the adhesive is applied to the substrate and then dried and cured, the heat-resistant resin fine powder is at a uniformly dispersed state in the heat resistant resin forming the matrix. Since there is a difference in the solubility in the oxidizing agent between the heat-resistant resin fine powder and the heat-resistant resin matrix, the fine powder dispersed in the surface of the adhesive layer is mainly dissolved and removed by treating the adhesive layer with the oxidizing agent to effectively form an anchor recess, whereby the surface of the adhesive layer can be toughened uniformly and hence the high adhesion strength and high reliability to the electroless plated film can be obtained.

In the above adhesive, easily available epoxy resins having excellent resistance to chemicals, heat resistance, electrical properties and hardness are used as the cured heat-resistant resin fine powder soluble in acid or oxidizing agent.

However, it has been confirmed that when the printed circuit board produced by using epoxy resin as a heat-resistant resin fine powder is used in an atmosphere of high temperature and humidity, dissolution and precipitation of copper forming the wiring circuit pattern are caused to lower the value of surface resistivity and hence a short circuit is formed between the patterns with the rapid advance of high densification in the printed circuit board.

Because, an ionic compound is used in the production of epoxy resin powder soluble in acid or oxidizing agent, so that sodium ion or chlorine ion remains in the epoxy resin fine powder and causes migration reaction as shown in the following reaction formulae (1)–(3) (see FIG. 15):

$$Na^+ + Cl^- + H_2O \rightarrow NaOH + HCl \qquad (1)$$

$$Cu + 2NaOH \rightarrow Cu(OH)_2 + 2Na^+ \qquad (2)$$

$$Cu + 2HCl \rightarrow CuCl_2 + 2H^+ \qquad (3)$$

Thus in the conventional printed circuit boards, there is still a problem that the reliability is lowered in accordance with the use condition due to the use of the epoxy resin inevitably containing sodium ion and chlorine ion.

SUMMARY OF THE INVENTION

It is an object of the invention to provide an adhesive having excellent resistance to chemicals, heat resistance, electrical properties, hardness and adhesion property.

It is another object of the invention to easily and cheaply produce a printed circuit board by using the above adhesive in form of a sheet, a prepreg or the like.

It is the other object of the invention to provide a printed circuit board having a high connecting reliability without forming short circuit between wiring circuit patterns.

The inventors have made various studies with respect to resins using no ionic compound in order to achieve the above objects, and found that adhesives for circuit boards having excellent resistance to chemicals, heat resistance, electrical properties and hardness are obtained without causing the above reactions by using amino resins as a heat-resistant resin fine powder soluble in an acid or an oxidizing agent.

According to a first aspect of the invention, there is the provision of an adhesive for printed circuit boards comprising an uncured heat-resistant resin matrix being insoluble in an acid or an oxidizing agent when being subjected to a curing treatment, and a cured fine powder of amino resin soluble in an acid or an oxidizing agent and dispersed thereinto.

As such an adhesive for printed circuit board, the inventors have aimed at a sheet-shaped adhesive having a semi-cured (B-stage state) adhesive film and ensuring qualities such as film thickness uniformity, strength and the like, or a prepreg adhesive formed by impregnating a semi-cured (B-stage state) adhesive into fibrous substrate and having qualities such as film thickness uniformity, strength and the like.

Therefore, it is not required to control adhesive applying conditions such as viscosity, thixotropy and the like in the step of producing the printed circuit board, so that the quality control of the film thickness uniformity, strength and the like is easy and the improved adhesive layer can be obtained, and as a result the invention has been accomplished.

According to a second aspect of the invention, there is the provision of a sheet-shaped adhesive formed by applying to a base film an adhesive comprising a semi-cured thermosetting or photosensitive heat-resistant resin matrix being insoluble in an acid or an oxidizing agent when being subjected to a curing treatment, and a cured fine powder of amino resin soluble in an acid or an oxidizing agent and dispersed thereinto, or a prepreg-like adhesive formed by impregnating a fibrous substrate with an adhesive comprising a semi-cured thermosetting or photosensitive heat-resistant resin matrix being insoluble in an acid or an oxidizing agent when being subjected to a curing treatment, and a cured fine powder of amino resin soluble in an acid or an oxidizing agent and dispersed thereinto.

According to a third aspect of the invention, there is the provision of a method of producing is printed circuit boards by forming electroless plated conductor circuits through an adhesive layer formed on a substrate, which comprises the steps of:

(1) forming onto a substrate an adhesive layer of an adhesive comprising an uncured heat-resistant resin matrix being insoluble in an acid or an oxidizing agent when being subjected to a curing treatment, and a cured fine powder of amino resin soluble in an acid or an oxidizing agent and dispersed thereinto;

(2) roughening a surface of said adhesive layer with an acid or an oxidizing agent; and (3) subjecting the roughened adhesive layer to an electroless plating to form a conductor circuit.

According to a fourth aspect of the invention, the printed circuit board obtained by the above method is a printed circuit board consisting of a roughened adhesive layer formed on at least one surface of a substrate and a conductor circuit formed on the roughened adhesive layer, said adhesive layer being composed of an adhesive comprising an uncured heat-resistant resin matrix being insoluble in an acid or an oxidizing agent when being subjected to a curing treatment, and a cured fine powder of amino resin soluble in an acid or an oxidizing agent and dispersed thereinto.

In the invention, an amount of the amino resin fine powder dispersed is 10–100 parts by weight based on 100 parts by weight as a solid content of the heat-resistant resin matrix. As the amino resin fine powder, there is used at least one of melamine resin, urea resin and guanamine resin.

The heat-resistant resin matrix is a thermosetting heat-resistant resin or a photosensitive heat-resistant resin. The thermosetting heat-resistant resin matrix is a mixture of an uncured polyfunctional epoxy resin or an uncured difunctional epoxy resin and an imidazole series curing agent. The photosensitive heat-resistant resin matrix is at least one photosensitive heat-resistant resin selected from uncured polyfunctional epoxy resin, uncured polyfunctional acryl group containing resin and uncured polyfunctional acrylic resin, or a mixture of the above resin and at least one photosensitive heat-resistant resin selected from difunctional epoxy resin and difunctional acrylic resin.

Preferably, the thermosetting heat-resistant resin matrix is a mixture of 98–90 wt % of the thermosetting heat-resistant resin consisting of 20–100 wt % as a solid content of the uncured polyfunctional epoxy resin and 80–0 wt % as a solid content of the uncured difunctional epoxy resin and 2–10 wt % as a solid content of the imidazole series curing agent. On the other hand, the photosensitive heat-resistant resin matrix is a mixture of 20–100 wt % as a solid content of at least one resin selected from the uncured polyfunctional epoxy resin, uncured polyfunctional acryl group containing resin and uncured polyfunctional acrylic resin and 80–0 wt % as a solid content of at least one resin selected from the uncured difunctional epoxy resin and uncured difunctional acrylic resin.

In the printed circuit board and the method of producing the same according to the invention, the adhesive layer is an adhesive layer formed by application, a sheet-shaped adhesive layer or a prepreg-like adhesive layer. As the substrate, use may be made of a substrate provided with conductor circuit.

BRIEF DESCRIPTION OF THE DRAWINGS

The invention will be described with reference to the accompanying drawings, wherein:

FIG. 1 is a partly sectional view illustrating production steps for the formation of a first embodiment of the printed circuit board according to the invention;

FIGS. 2 to 4 are partly sectional views illustrating production steps for the formation of various embodiments of the printed circuit board according to the invention, respectively; and FIG. 15 is a schematic view illustrating migration reaction in the printed circuit board.

FIGS. 1g, 2g, 3g, 4g, 5h, 6g, 7h, 8g, 9g, 10h, 11i, 12g, 13g and 14f illustrate enlarged views of portions of the printed circuit boards illustrated for the embodiments of FIGS. 1–14, respectively.

DESCRIPTION OF THE PREFERRED EMBODIMENTS

Figure 7A:
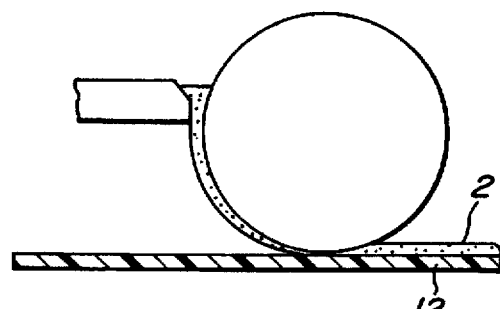

The adhesive for printed circuit board according to the invention will be described in detail below.

A phenomenon that the value of surface resistivity lowers due to the aforementioned migration reaction is observed in the known adhesives. For this end, the inventors have examined a change of resistivity on various resins while conducting a long-period aging test under conditions that a temperature was 40° C., a humidity was 90% and a voltage was 24 V.

As a result, polyimide resins, epoxy resins and the like are known as a resin having excellent electrical properties. Among these resins, it has been found that amino resins are most excellent as a resin being soluble in acid or oxidizing agent and having no change of the resistivity value with the lapse of time, i.e. a resin causing no so-called migration reaction.

According to the invention, therefore, since the cured amino resin fine powder soluble in acid or oxidizing agent is used as the heat-resistant rein fine powder, even when it is used under service conditions of high temperature and high humidity atmosphere, sufficient adhesion strength of the conductor is obtained without causing the migration, fusing the conductor circuit and lowering the value of surface resistivity. Furthermore, the resistance to chemicals, heat resistance, electrical properties and hardness become excellent.

The fine powder of amino resin for the formation of anchor recess by dispersing into the matrix is added to the heat-resistant resin matrix in an amount of 10–100 parts by weight per 100 parts by weight of total solid content of the matrix. When the amount of the fine powder added is less than 10 parts by weight, the anchors to be formed after the removal by dissolution are not clearly formed, while when it exceeds 100 parts by weight, the adhesive layer becomes porous and the adhesion strength (peel strength) between the adhesive layer and the electroless plated film lowers.

As the particle size of the amino resin fine powder, the average particle size is preferably not more than 10 μm, more particularly not more than 5 μm. When the average particle size is more than 10 μm, the density of the anchors formed after the removal by dissolution becomes small and ununiform and hence the adhesion strength and reliability lower. Furthermore, the unevenness of the surface in the adhesive layer becomes violent and the fine pattern of conductors is hardly obtained, which is unfavorable in the mounting of parts and the like.

The amino resin fine powder is desirable to be selected from the group consisting of agglomerate particles having an average particle size of 2–10 μm by agglomeration of heat-resistant resin powder having an average particle size of not more than 2 μm, a mixture of heat-resistant resin powder having an average particle size of 2–10 μm and heat-resistant resin powder having an average particle size of not more than 2 μm, and quasi-particles obtained by adhering at least one of heat-resistant resin powder having an average particle size of 2–10 μm and inorganic fine powder having an average particle size of not more than 2 μm to surface of heat-resistant resin powder having an average particle size of 2–10 μm.

The amino resin fine powder used in the invention is at least one fine powder of melamine resin, urea resin and guanamine resin. These resins have advantages that (1) the heat resistance is excellent, (2) the surface hardness is large, (3) the mechanical strength is excellent, (4) the electrical insulation, particularly resistance to arc discharge is excellent, (5) the resistance to organic solvent is excellent, (6) the solubility in acid or oxidizing agent is high, and the like.

Among these resins, the melamine resin is an addition condensate of melamine and formaldehyde, which produces white and water-insoluble resin through acidic reaction-or produces transparent and water-soluble resin through alkaline reaction.

That is, the melamine resin having the following chemical structure:

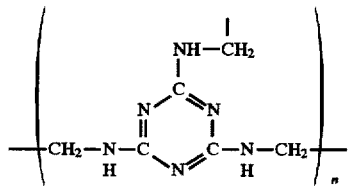

is obtained by reacting melamine with formaldehyde under neutral or alkaline condition to form methylol melamine, condensing the methylol melamine through dehydration and removal of formalin with acid or under heating, and then increasing the molecule through the formation of methylene bond and ether bond.

Further, the melamine resin as a molding material generally has a molar ratio of formaldehyde to melamine within a range of about 1:2–1:3. Particularly, as the molar ratio becomes higher, the molded product having a higher hardness is produced. Therefore, melamine and formaldehyde are reacted within the above molar ratio range at 80°–90° C. while maintaining neutral or slight alkaline condition with ammonia or the like, and then the resulting syrup is added with a base material such as rayon, pulp cloth piece, asbestos, fiber or the like, which is dried and pulverized and added with pigment, releasing agent, curing agent and the like and finely pulverized to form a molding material. Moreover, the molding material is sufficiently cured by heating under pressure without adding the curing agent, but a curing agent such as citric acid, phthalic acid, organic carboxylic acid ester or the like is generally used.

The urea resin having the following chemical formula:

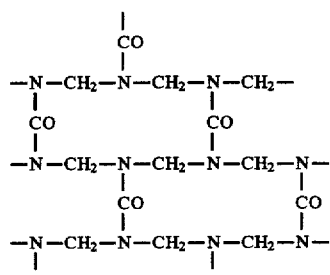

or

is obtained as a fluid containing 45–50% initial polymer by mixing urea and formalin at a molar ratio of about 1:2 and heating under neutral or alkaline condition to progress the reaction through monomethylol urea and dimethylol urea.

The urea resin is rendered into a molding material by mixing the initial polymer with a filler such as pulp, wood powder or the like, heating to promote polymerization, drying and pulverizing.

The guanamine resin having the following chemical structure:

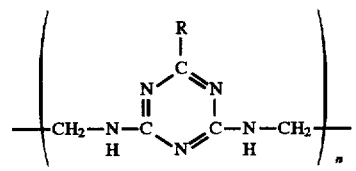

R:H, CH$_3$, C$_2$H$_5$, C$_6$H$_6$ etc.

is an addition condensate between guanamine and formaldehyde obtained by the same manner as in the melamine resin and urea resin. That is, the guanamine resin is obtained by condensing guanamine and formaldehyde by dehydration and removal of formalin in acid or through heating and then increasing molecule through methylene bond and ether bond.

According to the invention, a sheet-shaped adhesive having an adhesive layer of B-stage (a state of removing only solvent without curing reaction) which guarantees qualities such as film thickness uniformity, strength and the like, or a prepreg-like adhesive formed by impregnating an adhesive layer of B-stage which guarantees qualities such as film thickness uniformity, strength and the like, into a fibrous substrate is used as an adhesive for printed circuit board. Because the productivity of the printed circuit board can be improved by using such an adhesive state without damaging the electroless plating property.

That is, the adhesive for printed circuit board is rendered into the sheet-shaped adhesive having a film-like adhesive layer or the prepreg-like adhesive formed by impregnating the adhesive into the fibrous substrate, whereby the adhesive layer satisfying all properties such as film thickness, peel strength and the like can previously provided without controlling application conditions such as viscosity, thixotropy and the like.

As the heat-resistant resin matrix dispersing the above amino resin fine powder, there are used resins having excellent heat resistance, electrical insulation property, chemical stability and adhesion property and being hardly soluble in the oxidizing agent by curing treatment.

Such a thermosetting heat-resistant resin matrix is a mixture of uncured polyfunctional epoxy resin or uncured difunctional epoxy resin as a thermosetting heat-resistant resin and an imidazole series curing agent.

Particularly, epoxy resins of bisphenol-A type, bisphenol-F type, cresol novolac type and phenol novolac type, bismaleimido triazine resin, polyimido resin and phenolic resin are preferable as the thermosetting heat-resistant resin.

The thermosetting heat-resistant resin matrix is preferably a mixture of a thermosetting heat-resistant resin consisting of 20–100 wt % of the uncured polyfunctional epoxy resin and 80–0 wt % of the uncured difunctional epoxy resin as a solid content and 2–10 wt % as a solid content of the imidazole series curing agent. When the solid content of the polyfunctional resin is less than 20 wt %, the hardness of the adhesive lowers and also the resistance to chemicals lowers.

Furthermore, as the photosensitive heat-resistant resin matrix, there are used at least one photosensitive heat-resistant resin selected from uncured polyfunctional epoxy resin, resin having uncured polyfunctional acryl group and uncured polyfunctional acrylic resin, or a mixed resin of the above resin and at least one of difunctional epoxy resin and difunctional acrylic resin.

Preferably, resins obtained by acrylation of phenol aralkyl type or phenol novolac type epoxy resin, acrylic resins and photosensitive polyimido resin are used as the photosensitive heat-resistant resin.

The photosensitive heat-resistant resin matrix is preferably a mixture of 20–100 wt % as a solid content of at least one photosensitive heat-resistant resin selected from the uncured polyfunctional epoxy resin, the resin having uncured polyfunctional acryl group and the uncured polyfunctional acrylic resin and 80–0 wt % as a solid content of at least one of the uncured difunctional epoxy resin and the uncured difunctional acrylic resin. When the solid content of the polyfunctional resin is less than 20 wt %, the hardness of the adhesive lowers and also the resistance to chemicals lowers.

Moreover, DICY, amine series curing agent, acid anhydride and imidazole series curing agent are favorable as a curing agent for the heat-resistant resin matrix. Particularly, in case of the epoxy resin, it is preferable to add the imidazole series curing agent to the matrix in an amount of 2–10 wt % per total solid content of the matrix. When the amount of the imidazole series curing agent exceeds 10 wt %, the curing is too promoted to cause brittleness, while when it is less than 2 wt %, the curing is insufficient and the satisfactory hardness is not obtained.

In view of the enhancement of the storing stability, it is advantageous that the mixture obtained by dispersing the cured amino resin fine powder into the heat-resistant resin matrix of uncured polyfunctional epoxy resin or uncured difunctional epoxy resin is separately stored from the imidazole series curing agent and then mixed therewith immediately before the use.

As shown in FIG. 6a, the sheet-shaped adhesive may be formed by applying an adhesive solution, which is obtained by dispersing the cured amino resin fine powder into the heat-resistant resin matrix being hardly soluble in acid or oxidizing agent when being subjected to a curing treatment, onto a base film by means of a roll coater, a doctor bar or the like and then drying and curing in a drying furnace at 60°–100° C. to form an adhesive layer of a semi-cured state.

In this case, the thickness of the adhesive layer on the base film is adjusted to 25 . 70 μm by a gap of the doctor bar. Since the sheet-shaped adhesive is wound on a roll, a protection film (cover film) is formed on the adhesive layer to protect the adhesive layer of the semi-cured state.

As the base film being the substrate of the sheet-shaped adhesive, use may be preferably made of polyethylene terephthalate film, polypropylene film, polyethylene fluoride film (Tedolar film) and the like. The thickness of the film is desirable to be 25–50 µm. In order to facilitate the release of the base film, silicon may be applied to the surface of the base film contacting with the adhesive layer as a releasing agent. On the other hand, the other surface of the base film may be subjected to a mud treatment (roughness treatment).

The adhesive solution suitable for the formation of the adhesive layer on the base film is preferable to have a dynamic viscosity (JIS K7117), which is measured by means of a rotating viscometer at 60 rpm, of 10–2,000 cps, preferably 100–300 cps. When the viscosity is less than 10 cps, the adhesive layer having a sufficient peel strength is not obtained, while when the viscosity exceeds 2,000 cps, the adhesive solution can not be applied to the base film.

Moreover, the concentration of solid content in the adhesive solution is 45–75 wt %. When the concentration is less than 45 wt %, the solvent undesirably reamins, while when it exceeds 75 wt % sufficient application property (leveling property, removal of bubbles or the like) is not obtained. And also, the ratio of amino resin fine powder to heat-resistant resin in the solid content is 1/100–200/100, preferably 20/100–50/100 as a volume ratio. When the ratio is less than 1/100, distinct anchors are not formed, while when it exceeds 200/100, anchors are too closed to each other and the sufficient strength is obtained.

In the production of the sheet-shaped adhesive, a mixture of a resin having a high molecular weight (hereinafter shown by R) and a resin having a low molecular weight (hereinafter shown by r) is used as the heat-resistant resin constituting the heat-resistant resin matrix. Preferably, the molecular weight M of the resin R is $2,000<M \leq 100,000$, particularly $2,000 \leq M \leq 5,000$, and the molecular weight m of the resin r is $200<m \leq 2,000$, particularly $300 \leq m \leq 1,000$, and the mixing ratio by weight is $0.2 \leq r/(r+R) \leq 0.8$. Furthermore, in order that the melting point of the resin mixture is not lower than room temperature, it is favorable that the melting point of the resin R is within a range of 50°–50° C. and the melting point of the resin r is within a range of not lower than 10° C. but lower than 50° C.

Among the following performances (1)–(5) required for the formation of the film, the resin r is effective to the performances (1)–(3), while the resin R is effective to the performances (4)–(5), so that when the molecular weights M, m and the mixing ratio capable of developing all the above performances are outside the above ranges, the performances (1)–(5) lower.

(1) tackiness (tacking on the surface of the adhesive);

(2) flexibility (bending easiness);

(3) cutting property (fine cutting without cracking);

(4) edge fusion property (no flowing of the adhesive layer upon the standing of the film); and (5) durability to acid or oxidizing agent.

That is, when the resin mixture of the low and high molecular weights is used as the heat-resistant resin matrix, it is possible to raise the peel strength of the adhesive layer to not less than 2 kg/cm. Although this is not clear, it is considered that the resin mixture is densely filled in the matrix to increase the strength at breakage of the resin. Thus, the roughness of the roughened surface can be reduced to form a finer pattern.

In the production of the sheet-shaped adhesive, the average particle size of the amino resin fine powder used is ms small as possible for forming the adhesive layer film onto the base film having an excellent releasability, and is preferably 0.05–50 µm. When the average particle size exceeds 50 µm, the density of the anchor formed by dissolving removal is small and is apt to become ununiform, and hence the adhesion strength and reliability lower. Furthermore, the unevenness of the surface of the adhesive layer becomes violent and the film thickness becomes ununiform, and hence it is difficult to obtain a fine pattern of conductors and the mounting of parts and the like becomes undesirable.

As shown in FIG. 12a, the prepreg-like adhesive may be formed by immersing a fibrous substrate for impregnation into an adhesive solution, which is obtained by dispersing the cured amino resin fine powder into the heat-resistant resin matrix being hardly soluble in acid or oxidizing agent when being subjected to a curing treatment, or applying the adhesive solution onto the fibrous substrate for impregnation by means of a roll coater, a doctor bar or the like and then drying and curing in a drying furnace at 60°–100° C. to form an prepreg adhesive layer of a semi-cured state.

In this case, the thickness of the adhesive layer on tile fibrous substrate is usually adjusted to 25 . 70 µm. However, when the adhesive layer is used so as to serve as an interlaminar insulation layer between metal substrate and multilayer circuit board, the adhesive layer may be thickened by increasing the number of the layers.

As the fibrous substrate for impregnation in the prepreg-like adhesive, use may be preferably made of heat-resistant fibers such as glass cloth, aramide fiber and the like. The thickness of the substrate is desirable to be 50–300 µm.

The adhesive solution suitable for the impregnation into the fibrous substrate is preferable to have a dynamic viscosity (JIS K7117), which is measured by means of a rotating viscometer at 60 rpm, of 30–200 cps, preferably 40–100 cps. When the viscosity is less than 30 cps, the adhesive layer having a sufficient peel strength is not obtained, while when the viscosity exceeds 200 cps, the adhesive solution can not be applied to the base film.

Moreover, the concentration of solid content in the adhesive solution is 30–70 wt %. When the concentration is less than 30 wt %, the solvent undesirably remains, while when it exceeds 70 wt %, sufficient application property (leveling property, removal of bubbles or the like) is not obtained. And also, the ratio of amino resin line powder to heat-resistant resin in the solid content is 1/100–200/100, preferably 20/100–50/100 as a volume ratio. When the ratio is less than 1/100, distinct anchors are not formed, while when it exceeds 200/100, anchors are too closed to each other and the sufficient strength is obtained.

The production of printed circuit board using the adhesive according to the invention will be described in detail below.

(I) In the production of the printed circuit board using the adhesive according to the invention, an adhesive layer is first formed on an insulation substrate or a substrate having conductor circuit by using the adhesive obtained by dispersing the cured amino resin fine powder soluble in acid or oxidizing agent into the uncured heat-resistant resin matrix being hardly soluble in acid or oxidizing agent when being subjected to a curing treatment.

As the formation of the adhesive layer on the substrate, there are a method of applying the adhesive onto the substrate with a roll coater or the like and then drying and curing it, and a method of piling the sheet-shaped adhesive or prepreg-like adhesive on the substrate and then heating under pressure.

In the former method, the thickness of the adhesive layer is usually about 2–40 µm. If the adhesive layer is used so as to serve as an interlaminar insulation layer between metal substrate and multilayer circuit board, the adhesive layer may be thickened by increasing the number of the layers.

In the application of the adhesive, when the heat-resistant resin matrix is epoxy resin, it is preferable that a gap between coating roller and doctor bar is 0.2–0.6 mm and a travelling speed is 0.1–3.0 m/min. When the gap is wider than 0.6 mm, the scattering of the coating film is apt to be caused, while when it is narrower than 0.2 mm, it is difficult to obtain a proper film thickness. On the other hand, when the travelling speed is slower than 0.1 m/min, the productivity is poor, while when it is faster than 3.0 m/min, the film thickness becomes ununiform. Moreover, when the heat-resistant resin matrix is a resin having an acryl group or an acrylic resin, the same result as mentioned above is obtained.

In the method using the sheet-shaped adhesive, the sheet-shaped adhesive having the adhesive layer of the semi-cured state after the peeling of the protection film is piled onto the insulation substrate having a surface roughness of Rmax= about 2 μm or the substrate having the conductor circuit so as to face the adhesive layer to the substrate and then lamination cured or pressed under heating at 40°–120° C. under 40 kg/cm² and thereafter the base film is removed to form an adhesive layer for electroless plating.

In the method using the prepreg-like adhesive, the prepreg-like adhesive having the adhesive layer of the semi-cured state is laminated on the insulation substrate having a surface roughness of Rmax=about 2 μm or the substrate having the conductor circuit and then lamination cured or pressed under heating at 40°–120° C. under 40 kg/cm² to form an adhesive layer for electroless plating.

The above amino resin fine powder soluble in acid or oxidizing agent is a cured heat-resistant resin. The reason on the use of the cured amino resin fine powder is due to the fact that when the uncured amino resin fine powder is used and dispersed into a heat-resistant resin liquid forming the heat-resistant resin matrix or a solution of the heat-resistant resin as a matrix in a solvent, it dissolves into the resin liquid or the solution and hence it is impossible to develop the function as the amino resin fine powder.

The amino resin fine powder is produced, for example, by thermosetting the amino resin and pulverizing it by means of a jet mill, a refrigeration pulverizer or the like, or by spray drying the amino resin solution and then subjecting to a curing treatment, or by adding an aqueous solution of a curing agent to the uncured amino resin emulsion with stirring and then seiving the resulting particles by means of an air seiver or the like.

As a method of curing the heat-resistant resin constituting the heat-resistant resin fine powder, there are a method of curing by heating, a method of curing by addition of a catalyst and the like. Among these methods, the curing by heating is practical.

As a method of forming quasi-particles by adhering at least one of amino resin fine powder and inorganic fine powder to the surface of the amino resin particle, it is advantageous to use method wherein the surface of the amino resin particle is covered with the amino resin fine powder or the inorganic fine powder and then heated to fuse them to each other or adhered through a binder.

As a method of forming agglomerate particles, the amino resin particles are merely heated in a hot dryer or the like, or added and mixed with a binder and then dried, whereby the particles are agglomerated. Then, the agglomerated particles are pulverized by a ball mill, a ultrasonic dispersing machine or the like, and then seived through an air siever or the like.

The thus obtained amino resin fine powder has not only a spherical shape but also various complicated shapes. Therefore, the shape of the resulting anchor takes a complicated shape in accordance with the shape of the fine powder, which effectively acts to enhance the adhesion strengths of the plated film such as peeling strength, pulling strength and the like.

The amino resin fine powder is added to and uniformly dispersed into the heat-resistant resin liquid constituting the heat-resistant resin matrix or the solution of the heat-resistant resin as a matrix in a solvent.

As the heat-resistant resin liquid to be added with the amino resin fine powder, the heat-resistant resin containing no solvent may be used as it is, but the solution of the heat-resistant resin in the solvent is preferably used because the latter solution is easy in the adjustment of the viscosity for the uniform dispersion of the resin fine powder and is easily applied to the substrate. As the solvent for dissolving the heat-resistant resin, use may be made of usually used solvents such as methyl ethyl ketone, methyl cellosolve, ethyl cellosolve, butyl cellosolve, butyl cellosolve acetate, butyl carbitol, butyl cellulose, tetraline, dimethylformamide, n-methyl pyrrolidone and the like.

Furthermore, the heat-resistant resin liquid may be compounded with an organic filled such as fluorine resin, polyimide resin, benzoguanamine resin or the like, or a filler of an inorganic fine powder such as silica, alumina, titanium oxide, zirconia or the like. Other additives such as colorant (pigment), leveling agent, anti-foaming agent, ultraviolet absorber, flame retardant and the like may also be added.

In the manufacture of multilayer printed circuit board, via hole is formed in the adhesive layer for connecting conductor circuits to each other.

As the method for the formation of the via hole, when the photosensitive resin is used as the heat-resistant resin constituting the matrix, it is preferable to conduct development and etching after the exposure to light at given positions, but the formation of the via hole through laser working may be adapted. On the other hand, when the thermosetting resin is used as the heat-resistant resin, it is preferable to work the given positions through laser or by means of a drill. The formation of the via hole through laser working may be conducted before or after the surface roughening of the resin insulation layer.

As the substrate used in the invention, use may be made of plastic substrate, ceramic substrate, metal substrate and film substrate, an example of which includes glass epoxy substrate, glass polyimide substrate, alumina substrate, low temperature fired ceramic substrate, aluminum nitride substrate, aluminum substrate, iron substrate, polyimide substrate and the like. By using these substrates, single-sided circuit board, both-sided through hole circuit board and multilayer printed circuit board such as Cu/polyimide multilayer printed circuit board can be prepared.

Moreover, the adhesive itself is formed to be a plate shape or a film shape, whereby it is possible to make it a substrate having an adhesiveness capable of being subjected to an electroless plating.

(II) Next step is a treatment of roughening the surface of the adhesive layer formed on the substrate. In this step, when the heat-resistant resin matrix is the thermosetting resin, the adhesive layer of the uncured or semi-cured state (B-stage) formed on the substrate is thermoset into a cured state (C-stage) and thereafter at least a part of the amino resin fine powder dispersed into the surface portion of the adhesive layer is dissolved and removed with acid or oxidizing agent to roughen the surface of the adhesive layer.

On the other hand, when the photosensitive resin is used as the heat-resistant resin matrix in the adhesive layer, a photomask is closed onto the adhesive layer of the uncured or semi-cured state (B-stage) formed on the substrate and photocured into a cured state (C-stage) and thereafter unnecessary portions are subjected to a development treatment.

The removal of the amino resin fine powder dispersed onto the surface portion of the adhesive layer by dissolution may be carried out by immersing the substrate provided with the adhesive layer in solution of the acid or oxidizing agent, or by spraying the solution of the acid or oxidizing agent onto the substrate. Thus, the surface of the adhesive layer is roughened.

In order to effectively the removal by dissolution of the heat-resistant resin fine powder, it is very effective to lightly roughen the surface of the adhesive layer through polishing with fine powder abrasion agent or a liquid horming.

As the oxidizing agent roughening the adhesive layer, use may be made of chromic acid, chromate, permanganate, ozone and the like. As the acid, use may be made of hydrochloric acid, sulfuric acid, organic acid and the like.

(III) Next step is a treatment in which the surface of the roughened adhesive layer is subjected to an electroless plating to form a necessary conductor pattern. As the electroless plating, mention may be made of electroless copper plating, electroless nickel plating, electroless tin plating, electroless gold plating, electroless silver plating and the like. Especially, at least one method selected from electroless copper plating, electroless nickel plating and electroless gold plating is preferably used.

Moreover, according to the method of the invention, it is possible to conduct another different electroless plating or electric plating, or to coat a soldering in addition to the above electroless plating.

In the method according to the invention, the above conductor circuit can be formed by various methods on the known printed circuit boards. For example, there may be adopted a method of etching a circuit after the substrate is subjected to the electroless plating, a method of directly forming a circuit at the time of electroless plating and the like.

In case of producing the multilayer printed circuit board according to the method of the invention, there is adopted an additive process in which holes for via hole are formed and then the electroless plating is conducted in the same manner as described above. Moreover, the use of the photosensitive resin is effective to particularly produce a build-up multi layer printed circuit board.

According to the methods of the invention, there are obtained a one-sided printed circuit board in which a plated resist 3 and conductor circuit 4 are formed on a substrate 1 through an adhesive layer 2 as shown in FIGS. 1f, 2f and 6f, a both-sided through hole printed circuit board in which the plated resist 3 and the conductor circuit 4 are formed on both surfaces of the substrate 1 through the adhesive layer 2 and through holes 5 as shown in FIG. 3f, and a build-up multilayer printed circuit board in which conductor circuits (4, 6, 8, 10) are formed on a substrate 1' provided with a first conductor layer 4 through an interlaminar layer (adhesive layer) 2 having via hole 7.

In any case, the adhesive layer is obtained by dispersing the cured amino resin fine powder soluble in acid or oxidizing agent into the uncured heat-resistant resin matrix being hardly soluble in acid or oxidizing agent when being to the curing treatment.

According to the invention, the adhesive having excellent resistance to chemicals, heat resistance, electric properties, hardness and adhesion property can stably be provided by using the amino resin fine powder.

Furthermore, when such an adhesive is used in form of a sheet or a prepreg, the printed circuit board can easily and cheaply be produced without damaging the electroless plating property.

In the printed circuit boards obtained by using the above adhesive according to the invention, there is caused no migration reaction, so that the connection reliability is high without forming short circuit between patterns.

The following examples are given in illustration of the invention and are not intended as limitations thereof.

EXAMPLE 1

(1) 1275 parts by weight of melamine resin was mixed with 1366 parts by weight of 37% formalin and 730 parts by weight of water, which was adjusted to pH=9.0 with 10% sodium carbonate, held at 90° C. for 60 minutes and then added with 109 parts by weight of methanol.

(2) The resulting resin liquid was dried by spray drying method to obtain a powdery resin.

(3) The resin powder was pulverized and mixed with a releasing agent and a curing catalyst in a ball mill to obtain a mixed resin powder.

(4) The mixed resin powder was placed in a mold heated at 150° C. and held under a pressure of 250 kg/cm$^2$ for 60 minutes to obtain a shaped body. Moreover, the mold was opened during the molding to escape gas.

(5) The shaped body was pulverized in a ball mill to obtain heat-resistant resin fine powders having particle sizes of 0.5 μm and 5.5 μm, respectively.

(6) Separately, 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) were dissolved in butylcellosolve acetate to obtain a resin matrix composition. Then, 100 parts by weight of this composition was mixed with 15 parts by weight of the above fine powder having a particle size of 0.5 μm and 30 parts by weight of the above fine powder having a particle size of 5.5 μm, which was kneaded through three rolls and further added with butylcellosolve acetate to prepare an adhesive solution having a solid content of 75%. The viscosity of the solution was measured by means of a digital viscometer made by Tokyo Keiki Co., Ltd. at 20° C. for 60 seconds according to JIS K7117 to be 5.2 Pa.s at 6 rpm and 2.6 Pa.s at 60 rpm, and the value of SVI (thixotropy) was 2.0.

(7) A glass epoxy substrate 1 was roughened by polishing to form a roughened surface of JIS B0601 Rmax=2–3, and then the adhesive solution of the above item (6) was applied onto the substrate by means of a roll coater. In this case, a coating roll for resist of middle and high viscosity (made by Dainihon Screen Co., Ltd.) was used as the coating roll, in which a gap between coating roll and doctor bar was 0.4 mm and a gap between coating roll and back-up roll was 1.4 mm and a travelling speed was 400 mm/s. Thereafter, it was left to stand at a horizontal state for 20 minutes and dried at 70° C. to obtain an adhesive layer 2 having a thickness of about 50 μm (see FIGS. 1b, 1c).

(8) The substrate 1 provided with the adhesive layer 2 was immersed in an oxidizing agent consisting of an aqueous solution of 500 g/l chromic acid ($CrO_3$) at 70° C. for 15 minutes to roughen the surface of the adhesive layer 2, further immersed in a neutral solution (made by Shipley) and washed with water. A paradium catalyst (made by Shipley) was applied to the roughened adhesive layer 2 on the substrate 1 to activate the surface of the adhesive layer 2 (see FIG. 1d).

(9) Then, the substrate 1 was heat-treated at 120° C. in an atmosphere of nitrogen gas (10 ppm oxygen) for 30 minutes for the fixation of the catalyst. Thereafter, a photosensitive dry film was laminated thereon, exposed to a light and developed with a modified chlorocene to form a plating resist 3 (thickness 40 µm) (see FIG. 1e).

(10) The substrate 1 having the plating resist 3 was immersed in an electroless copper plating solution having a composition as shown in the following Table 1 for 11 hours to form electroless copper plated films 4 having a thickness of 25 µm (see FIG. 1f).

TABLE 1

| copper sulfate | 0.06 mol/l |
| --- | --- |
| formalin (37%) | 0.30 mol/l |
| sodium hydroxide | 0.35 mol/l |
| EDTA | 0.35 mol/l |
| additive | few |
| plating temperature | 70–72° C. |
| pH | 12.4 |

EXAMPLE 2

(1) A suspension obtained by dispersing 200 g of melamine resin particles (average particle size 3.9 µm) prepared in the same manner as in the items (1)–(5) of Example 1 into 5 l of acetone was added dropwise with a suspension obtained by dispersing 300 g of melamine resin fine powder (average particle size 0.5 µm) prepared in the same manner as in the items (1)–(5) of Example 1 into 10 l of acetone with stirring in a Henshel mixer (made by Mitsui Miike Kakoki Co., Ltd.), whereby the melamine resin fine powder was adhered to the surfaces of the melamine resin particles. After the removal of acetone, they were heated at 150° C. to prepare false particles. The false particles had an average particle size of about 4.3 µm. Moreover, about 75% by weight of the false particles were existent around the above average particle size with a range of ±2 µm.

(2) A mixture of 50 parts by weight of the false particles prepared in the above item (1), 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) was added with butyl carbitol and adjusted in a homodisper dispersing machine to prepare an adhesive solution having a solid content of 80%. The viscosity of this solution was 5.8 Pa.s at 6 rpm and 2.0 Pa.s at 60 rpm, and the value of SVI (thixotropy) was 2.9.

(3) A printed circuit board was manufactured by using the adhesive solution in the same manner as in Example 1 (see FIG. 2).

EXAMPLE 3

(1) The melamine fine powder (average particle size 3.9 µm) obtained in the same manner as in the items (1)–(5) of Example 1 was placed in a hot dryer and agglomerated by heating at 180° C. for 3 hours. The thus agglomerated melamine resin fine powder was dispersed into acetone, pulverized in a ball mill for 5 hours and seived in an air siever to prepare agglomerate particles. The agglomerate particles had an average particle size of about 3.5 µm, about 68% by weight of which was existent around the above average particle size within a range of ±2 µm.

(2) A mixture of 50 parts by weight of the agglomerate particles prepare in the above item (1), 60 parts by weight of phenol-novolac type epoxy resin (made by Yuka Shell Co., Ltd.), 40 parts by weight of bisphenol-A type epoxy resin (made by Yuka Shell Co., Ltd.) and 4 parts by weight of an imidazole curing agent (made by Shikoku Kasei Co., Ltd.) was added with butyl carbitol to prepare an adhesive solution having a solid content of 80%. The viscosity of this solution was 5.4 Pa.s at 6 rpm and 2.0 Pa.s at 60 rpm, and the value of SVI (thixotropy) was 2.2.

(3) After both surfaces of a glass epoxy substrate 1 were roughened by polishing to have a surface roughness of JIS B0601 Rmax=2–3 µm, the adhesive solution prepare in the above item (2) was applied to the substrate 1 by means of a roll coater, which was left to stand at a horizontal state for 20 minutes and dried at 70° C. to form an adhesive layer 2 having a thickness of about 45 µm (see FIGS. 3b, 3c).

(4) Then, the substrate 1 provided with the adhesive layer 2 was pierced by a drill and lightly buffed to expose the filler surface and thereater the substrate was immersed in an aqueous solution of 6N sulfuric acid at 70° C. for 15 minutes to roughen the surface of the adhesive layer 2, immersed in a neutral solution (made by Shipley) and washed with water. A paradium catalyst (made by Shipley) was applied onto the roughened adhesive layer on the substrate 1 to activate the surface of the adhesive layer (see FIGS. 3d, 3e).

(5) The substrate 1 treated in the above item (4) was heat-treated at 20° C. in an atmosphere of nitrogen gas (10 ppm oxygen) for 30 minutes for the fixation of the catalyst. Thereafter, a photosensitive dry film was laminated, exposed to a light and developed with a modified chlorocene to form a plating resist 3 (thickness 40 µm) (see FIG. 3f).

(6) After the formation of the plating resist 3, the substrate 1 was immersed in an electroless copper plating solution having the same composition as shown in Table 1 for 11 hours to form electroless copper plated films of 30 µm in thickness on both surfaces, and then conductor circuit and through holes 5 were formed to manufacture a both-sided printed circuit board (see FIG. 3f).

EXAMPLE 4

(1) A photosensitive dry film (made by DuPont) was laminated onto a glass epoxy copper laminated plate (made by Toshiba Chemical Products Co., Ltd.) and exposed to ultraviolet ray through a mask film having a desired conductor circuit pattern. Then, it was developed with 1,1,1-trichloroethane and non-conductor portion of copper was removed with an etching solution of copper chloride and thereafter the dry film was peeled off with ethylene chloride. Thus, there was obtained the substrate having a first conductor layer 4 comprised of plural conductor patterns (see FIG. 4a).

(2) 60 parts by weight of 50% acrylated product of cresol-novolac type epoxy resin (made by Yuka Shell Co., Ltd.), 40 parts by weight of bisphenol-A type epoxy resin (made by Yuka Shell Co., Ltd.), 15 parts by weight of diallyl terephthalate, 4 parts by weight of 2-methyl-1-[4-(methylthio)phenyl]-2-morpholinopropanone-1 (made by Ciba Geigy), 4 parts by weight of an imidazole curing agent (made by Shikoku Kasei Co., Ltd.) and 50 parts by weight of hollow melamine resin fine powder (made by Honen Co., Ltd.: particle size 2 µm) were mixed and added with butyl cellosolve, which was stirred in a homodisperser agitator. Then, the mixture was kneaded through three rolls to prepare a photosensitive adhesive layer having a solid content of 70%. This solution had viscosities of 5.0 Pa.s at 6 rpm and 2.5 Pa.s at 60 rpm and a SVI value of 2.0.

(3) The adhesive solution of the photosensitive resin composition prepared in the above item (2) was applied onto the substrate 1 of the above item (1) by means of a roll coater, which was left to stand at a horizontal state for 20 minutes and dried at 70° C. to form a photosensitive adhesive layer 2 having a thickness of about 50 μm (see FIGS. 4b, 4c).

(4) A photomask film printed with black circles of 100 μm in diameter was closed onto the substrate 1 treated in the item (3) and exposed to a super-high vapor pressure mercury lamp at 500 mj/cm$^2$. Then, it was developed with 1,1,1-trichloroethane through ultrasonic treatment to form opening s as via holes of 100 μm in diameter on the substrate 1, which was then exposed to a super-high vapor pressure mercury lamp at about 3000 mj/cm$^2$ and heat-treated at 100° C. for 1 hour and at 150° C. for 10 hours to form an adhesive layer 2 provided with openings 7 corresponding to the photomask film and having excellent size accuracy (see FIG. 4d).

(5) The substrate 1 treated in the item (4) was immersed in an aqueous solution of 500 g/l chromic acid ($CrO_3$) as an oxidizing agent at 70° C. for 15 minutes to roughen the surface of the adhesive layer 2, which was immersed in a neutral solution (made by Shipley) and washed with water. A paradium catalyst (made by Shipley) was applied onto the roughened adhesive layer 2 on the substrate 1 to activate the surface of the adhesive layer 2, which was immersed in an electroless plating solution having the same composition as shown in Table 1 for 11 hours to form an electroless plated copper film 6 having a thickness of 25 μm (see FIGS. 4d, 4e).

(6) By repeating the steps of the above items (3)–(5) two times was manufactured a build-up multilayer printed circuit board having four circuit layers (4,6,8,10) (see FIG. 4f).

EXAMPLE 5

(1) 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) were dissolved in butylcellosolve acetate to obtain a resin matrix composition. Then, 100 parts by weight of this composition was mixed with 15 parts by weight of the resin particles having a particle size of 0.5 μm and 30 parts by weight of the resin particles having a particle size of 5.5 μm as prepared in the items (1)–(5) of Example 1, which was kneaded through three rolls and added with butylcellosolve acetate to prepare an adhesive solution having a solid content of 75%. This solution had viscosities of 5.2 Pa.s at 6 rpm and 2.6 Pa.s at 60 rpm as measured by means of a digital viscometer made by Tokyo Keiki Co., Ltd. at 20° C. for 60 seconds according to JIS K7117 and an SVI value (thixotropy) of 2.0.

(2) After the resin surface and conductor circuit surface of the substrate 1 having the first circuit layer 4 produced in the same manner as in the item (1) of Example 4 were roughened by polishing to have a surface roughness of JIS B0601 Rmax=2–3 μm, the adhesive solution prepared in the above item (1) was applied to the substrate 1 by means of a roll coater. In this application, a coating roll for resist in high-middle viscosity (made by Dainihon Screen Co., Ltd.) was used as the coating roll, in which a gap between coating roll and doctor bar was 0.4 mm, and a gap between coating roll and back-up roll was 1.4 mm and a travelling speed was 400 mm/s. Thereafter, it was left to stand at a horizontal state for 20 minutes and dried at 70° C. to form an adhesive layer 2 having a thickness of about 50 μm (see FIGS. 5b, 5c).

(3) The substrate 1 provided with the adhesive layer 2 was immersed in an aqueous solution of 500 g/l Chromic acid ($CrO_3$) as an oxidizing agent to roughen the surface of the adhesive layer 2, which was immersed in a neutral solution (made by Shipley) and washed with water. Further, openings 7 for via hole were formed through laser (see FIG. 5d), and a paradium catalyst (made by Shipley) was applied to the roughened adhesive layer on the substrate 1 to activate the surface of the adhesive layer 2.

(4) The substrate 1 was heat-treated at 120° C. in an atmosphere of nitrogen gas (10 ppm oxygen) for 30 minutes for the fixation of the catalyst, and thereafter a photosensitive dry film was laminated and exposed to a light and developed with a modified chlorocene to form a plating resist (thickness 40 μm) (see FIG. 5e).

(5) After the formation of the plating resist 3, the substrate 1 was immersed in an electroless copper plating solution having the same composition as shown in Table 1 to form an electroless plated copper film 6 having a thickness of 25 μm (see FIG. 5f).

(6) By repeating the above items (2)–(5) two times was manufactured a multilayer printed circuit board (see FIG. 5g).

EXAMPLE 6

This example was fundamentally the same as in Example 4 except that the adhesive solution was obtained by mixing 60 parts by weight of 60% acrylated product of cresol-novolac type epoxy resin (made by Yuka Shell Co., Ltd.), 40 parts by weight of bisphenol-A type epoxy resin (made by Yuka Shell Co., Ltd.), 15 parts by weight of diallyl terephthalate, 4 parts by weight of 2-methyl-1-[4-(methylthio)phenyl]-2-morrpholinopropanone-1 (made by Ciba Geigey), 4 parts by weight of an imidazole curing agent (made by Shikoku Kasei Co., Ltd.) and 50 parts by weight of hollow melamine resin particles (made by Honen Co., Ltd.: particle size 2 μm), stirring them in a homodisper agitator while adding butylcellosolve and kneading through three rolls to have a solid content of 70%. The solution had viscosities of 5.0 Pa.s at 6 rpm and 2.5 Pa.s at 60 rpm and an SVI value of 2.0.

EXAMPLE 7

This example was fundamentally the same as in Example 4 except that the adhesive solution was obtained by mixing 100 parts by weight of 50% acrylated product of orthocresol-novolac type epoxy resin (made by Nihon Kayaku Co., Ltd.), 15 parts by weight of diallyl terephthalate, 4 parts by weight of 2-methyl-1-[4-(methylthio)phenyl]-2-morrpholinopropanone-1 (made by Ciba Geigey), 4 parts by weight of an imidazole curing agent (made by Shikoku Kasei Co., Ltd.), a photoinitiator (made by Ciba Geigey) and 50 parts by weight of hollow melamine resin particles (made by Honen Co., Ltd.: particle size 2 μm), stirring them in a homodisper agitator while adding butylcellosolve and kneading through three rolls to have a solid content of 70%. The solution had viscosities of 5.1 Pa.s at 6 rpm and 2.6 Pa.s at 60 rpm and an SVI value of 2.0

EXAMPLE 8

This example was fundamentally the same as in Example 4 except that the adhesive solution was obtained by mixing 50 parts by weight of false particles prepared in the same manner as in the item (1) of Example 2, 100 parts by weight of 60% acrylated product of orthocresol-novolac type epoxy resin (made by Nihon Kayaku Co., Ltd.), 15 parts by weight of diallyl terephthalate, 4 parts by weight of 2-methyl-1-[4-

(methylthio)phenyl]-2-morrpholinopropanone-1 (made by Ciba Geigey), 4 parts by weight of an imidazole curing agent (made by Shikoku Kasei Co., Ltd.) and a photoinitiator (made by Ciba Geigey), stirring them in a homodisper agitator while adding butylcellosolve and kneading through three rolls to have a solid content of 70%. The solution had viscosities of 5.1 Pa.s at 6 rpm and 2.6 Pa.s at 60 rpm and an SVI value of 2.0.

EXAMPLE 9

This example was fundamentally the same as in Example 4 except that the adhesive solution was obtained by dissolving 60 parts by weight of phenol-novolac type epoxy resin (made by Yuka Shell Co., Ltd.), 40 parts by weight of difunctional acrylic resin (made by Yuka Shell Co., Ltd.) and 4 parts by weight of an imidazole curing agent (made by Shikoku Kasei Co., Ltd.) in butyicellosolve acetate, mixing 100 parts by weight as a solid content of the resulting composition with 15 parts by weight of the melamine resin particles having a particle size of 0.5 μm and 30 parts by weight of the melamine resin particles having a particle size of 5.5 μm through three rolls and adding butylcellosolve so as to have a solid content of 75%.

EXAMPLE 10

This example was fundamentally the same as in Example 4 except that the adhesive solution was obtained by dissolving 60 parts by weight of 60% acrylated product of phenol-novolac type epoxy resin (made by Yuka Shell Co., Ltd.), 40 parts by weight of difunctional acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of the melamine resin particles having a particle size of 0.5 μm and 30 parts by weight of the melamine resin particles having a particle size of 5.5 μm through three rolls and adding butylcellosolve so as to have a solid content of 75%.

EXAMPLE 11

This example was fundamentally the same as in Example 4 except that the adhesive solution was obtained by dissolving 60 parts by weight of acrylic resin (made by Yuka Shell Co., Ltd.), 40 parts by weight bisphenol-A type epoxy resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of the melamine resin particles having a particle size 0.5 μm and 30 parts by weight of the melamine resin particles having a particle size of 5.5 μm through three rolls and adding butylcellosolve so as to have a solid content of 75%.

EXAMPLE 12

This example was fundamentally the same as in Example 4 except that the adhesive solution was obtained by dissolving 60 parts by weight of acrylic resin (made by Yuka Shell Co., Ltd.), 40 parts by weight difunctional acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of the melamine resin particles having a particle size of 0.5 μm and 30 parts by weight of the melamine resin particles having a particle size of 5.5 μm through three rolls and adding butylcellosolve so as to have a solid content of 75%.

EXAMPLE 13

This example was fundamentally the same as in Example 4 except that the adhesive solution was obtained by dissolving 100 parts by weight of acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of the melamine resin particles having a particle size of 0.5 μm and 30 parts by weight of the melamine resin particles having a particle size of 5.5 μm through three rolls and adding butylcellosolve so as to have a solid content of 75%.

EXAMPLE 14

(1) Urea and formalin were mixed at a mol ratio of 1:2 and heat-treated at 80° C. to obtain a polymer containing 45–50 wt % of monomethylol urea and dimethylol urea.

(2) The polymer was added with sodium phosphate and heat-treated to obtain a three-dimensional resin.

(3) The three-dimensional resin was pulverized by means of a ultrasonic jet grinder and salved with an air slaver to obtain urea resin fine powder having an average particle size of 0.8 μm.

(4) This example was fundamentally the same as in Example 1 except that the urea resin fine powder obtained in the above items (1)–(3) was used as the amino resin fine powder. Moreover, the adhesive solution had viscosities of 5.0 Pa.s at 6 rpm and 2.5 Pa.s at 60 rpm as measured by means of a digital viscometer made by Tokyo Ketki Co., Ltd. at 20° C. for 60 seconds and an SVI value (thixotropy) of 2.0.

EXAMPLE 15

(1) A mixture of 500 parts by weight melamine resin, 750 parts by weight of acetoguanamie resin, 1200 parts by weight of 37% formalin and 800 parts by weight of water was used as a starting material and cured and pulverized in the same manner as in the items (1)–(5) of Example 1 to obtain fine powder of melamine-acetoguanamine cocondensed resin.

EXAMPLE 16

(1) A resin matrix composition was obtained by dissolving 60 parts by weight of phenol-novolac type epoxy resin (made by Nihon Kayaku Co., Ltd.: molecular weight=3600, mp=90° C.), 40 parts by weight of bisphenol-A type epoxy resin (made by. Yuka Shell Co., Ltd.: molecular weight=900, mp=64° C.) and 5 parts by weight of an imidazole curing agent (made by Shikoku Shell Co., Ltd.) in butylcellosolve acetate. Then, 100 parts by weight as a solid content of the composition was mixed with 15 parts by weight of the melamine resin fine powder having a particle size of 0.5 μm and 30 parts by weight of the melamine resin fine powder having a particle size of 5.5 μm obtained in the same manner as in the items (1)–(5) of Example 1 in a ball mill and added with butylcellosolve acetate to prepare an adhesive solution having a solid content of 60%. This solution had a viscosity of 0.2 Pa.s at 60 rpm as measured by means of a digital viscometer at 20° C. for 60 seconds according to JIS K7117.

(2) The adhesive solution was applied to a PET (polyethylene terephthalate) film 14 coated at its surface with silicon coat through a doctor blade 16 and dried in an IR furnace 15 at 80° C. for 20 minutes to provide B-stage (semi-cured state) and further a cover film 11 of polyethylene (for protecting the surface of the adhesive) was laminated thereon to prepare a sheet-shaped adhesive (see FIG. 6a).

(3) After a glass epoxy substrate 1 was roughened at both surfaces by polishing to have a surface roughness of JIS B0601 Rmax=2–3 µm, the sheet-shaped adhesive of the item (2) was laminated onto the roughened surface of the substrate and heated at 80° C. under a pressure of 3 kg/cm² to form an adhesive layer 2 having a thickness of about 50 µm (see FIGS. 6b, 6c).

(4) The both-sided printed circuit board was manufactured by the same method as in the items (8)–(10) of Example 1 (see FIG. 6).

EXAMPLE 17

(1) An adhesive solution having a solid content of 55% was prepared by dissolving 60 parts by weight of phenol-novolac type epoxy resin (made by Yuka Shell Co. Ltd.), 40 parts by weight of bisphenol-A type epoxy resin (made by Yuka Shell Co., Ltd.) and 5 parts by weight of an imidazole curing agent (made by Shikoku Kasei Co., Ltd.) in butylcellosolve, mixing. 100 parts by weight as a solid content of the resulting composition with 15 parts by weight of melamine resin fine powder (made by Honen Co., Ltd.) having a particle size of 0.5 µm and 30 parts by weight of the melamine resin fine powder having a particle size of 5.5 µm pulverized in a ball mill, kneading through three rolls and adding butylcellosolve thereto. This solution had viscosities of 2.6 Pa.s at 6 rpm and 1.0 Pa.s at 60 rpm and an SVI value (thixotropy) of 2.6.

Figure 7B:
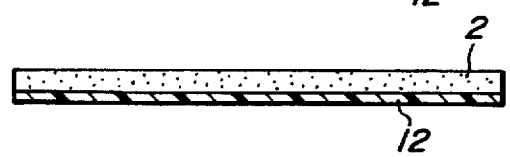

(2) The adhesive was applied to a polyethylene film 11 provided with a silicon coating means of a roll coater and dried by heating at 120° C. for 30 minutes to obtain a sheet-shaped adhesive (see FIGS. 7a, 7b).

Figure 7C:
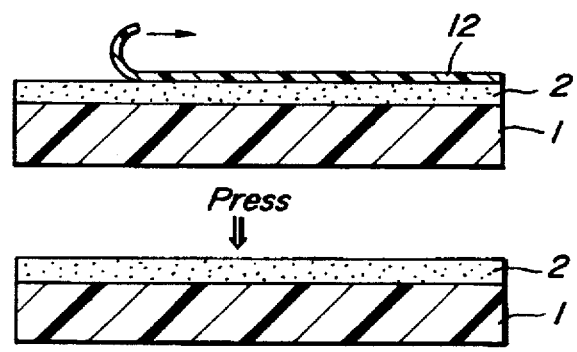
Figure 7E:
Figure 7F:
Figure 7G:
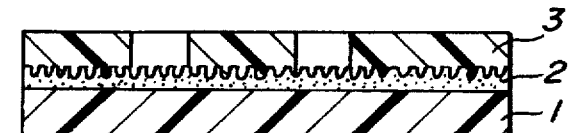
Figure 7H:
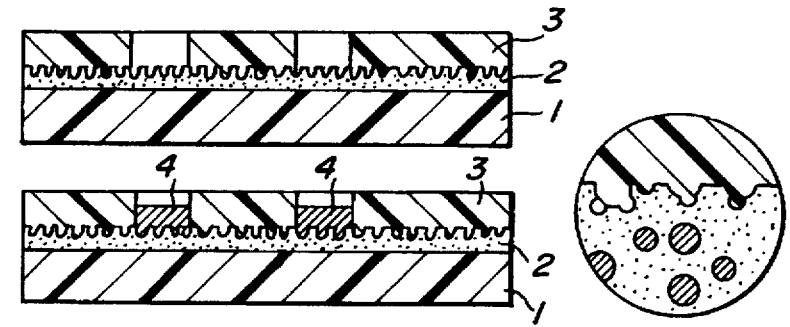

(3) The sheet-shaped adhesive was piled onto the substrate 1, and after the polyethylene film 11 was peeled off, it was pressed under heating to obtain an adhesive layer 2 (see FIGS. 7c, 7d).

(4) A printed circuit board was manufactured in the same manner as in the items (8)–(10) of Example 1 (see FIG. 7).

EXAMPLE 18

(1) An adhesive solution having a solid content of 50% was prepared by adding butyl carbitol to a mixture of 50 parts by weight of false particles prepared in the same manner as in the item (1) of Example 2, 30 parts by weight of cresol-novolac type epoxy resin (made by Nihon Kayaku Co., Ltd.: molecular weight=2500, mp=60° C.), 40 parts by weight of phenol-novolac type epoxy resin (made by Yuka Shell Co., Ltd.: molecular weight=700, mp=40° C.), 30 parts by weight of bisphenol-A type epoxy resin (made by Yuka Shell Co., Ltd.: molecular weight=500, mp=25° C.) and 5 parts by weight of an imidazole curing agent (made by Shikoku Kasei Co., Ltd.) and adjusting in a homodisper dispersing machine. The viscosity of this solution was 0.1 Pa.s at 60 rpm.

(2) The adhesive solution was applied to a Tedolar film 12 (made by DuPont) by means of a doctor blade, dried in a continuous furnace 15 at 100° C. for 5 minutes to provide B-stage (semi-cured stake) and, a cover film 11 of polyethylene (for protecting the adhesive surface) was laminated thereon to form a sheet-shaped adhesive (see FIG. 8a).

(3) A both-sided printed circuit board was manufactured in the same manner as in Example 16 (see FIG. 8).

EXAMPLE 19

(1) An adhesive solution having a solid content of 65% was prepared by dissolving 50 parts by weight of false particles prepared in the same manner as in the item (1) of Example 3, 80 parts by weight of special functional epoxy resin (made by Nihon Kayaku Co., Ltd.: molecular weight= 3200, mp=60° C.), 20 parts by weight of bisphenol-A type epoxy resin (made by Yuka Shell Co., Ltd.: molecular weight=500, mp=25° C.) and 7 parts by weight of a quazole curing agent (made by Shikoku Kasei Co., Ltd.) in butyl carbitol. The viscosity of this solution was 0.3 Pa.s at 60 rpm.

(2) The adhesive solution was applied to a commercially available prepreg 13 by means of a doctor blade 16 and dried at 100° C. for 5 minutes to provide B-stage (semi-cured state) and a cover film 11 of polyethylene (for protecting the adhesive surface) and further PET (polyethylene terephthalate) film 14 for protecting the adhesive layer 2 were laminated thereon to prepare a sheet-shaped adhesive (see FIG. 9a).

(3) While peeling off the cover film 11, 5 commercially available prepregs and the sheet-shaped adhesive were piled one upon the other so as to contact with the adhesive layer 2, which was pressed at 150° C. and 50 kg/cm² for 200 minutes and thereafter the PET film 14 was peeled off to obtain the substrate 1 provided at both surfaces with the adhesive layers 2 (see FIGS. 9b, 9c).

(4) A printed circuit board was manufactured in the same manner as in the items (4)–(6) of Example 3. (see FIG. 9).

EXAMPLE 20

This example was fundamentally the same as in Example 15 except that the adhesive solution was obtained by dissolving 50 parts by weight of special trifunctional epoxy resin (molecular weight=3000, mp=80° C.), 50 parts by weight of novolac type polyfunctional epoxy resin (molecular weight=500, mp=35° C.) and 7 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 µm and 30 parts by weight of the melamine resin fine powder having a particle size of 5.5 µm obtained by the same method as in the items (1)–(5) of Example 1 in a ball mill and further adding butylcellosolve to provide a solid content of 455. This solution had a viscosity of 0.1 Pa.s at 60 rpm as measured by means of a digital viscometer at 20° C. for 60 seconds according to JIS K7117.

EXAMPLE 21

(1) 80 parts by weight of 50% acrylated product of cresol-novolac type epoxy resin (made by Yuka Shell Co., Ltd.), 20 parts by weight of bisphenol-A type epoxy resin (made by Yuka Shell Co., Ltd.), 15 parts by weight of diallyl terephthalate, 4 parts by weight of 2-methyl-1-[4-(methylthio)phenyl]-2-morpholinopropanone-1 (made by Ciba Gelgay), 4 parts by weight of an imidazole curing agent and 50 parts by weight of hollow melamine resin fine powder (made by Honen Co., Ltd.: particle size 2 µm) were mixed and added with a leveling agent, which was stirred in a homodisper agitator while adding butylcellosolve and then kneaded in a ball mill to prepare a photosensitive adhesive solution having a solid content of 50%. The viscosity of this solution was 0.5 Pa.s at 60 rpm.

(2) The adhesive solution was applied to a polypropylene film 12 provided with a silicon coat in the same manner as in Example 14 to prepare a sheet-shaped photosensitive adhesive.

(3) Then, the sheet-shaped photosensitive adhesive of the item (2) was piled on the substrate 1 provided with first circuit layer 4 prepare in the same manner as in the item (1) of Example 4 and heated at 80° C. under a pressure of 3 kg/cm$^2$ to form an adhesive layer 2 (see FIGS. 10b, 10c).

(4) A photomask film printed by black circles of 100 µm in diameter was closed to the substrate 1 treated in the above item (3) and exposed to a super-high vapor pressure mercury lamp at 500 mj/cm$^2$. This was subjected to ultrasonic developing treatment with 1,1,1-trichloroethane to form opening for via hole of 100 µm in diameter on the circuit board 1', which was further exposed to a super-high vapor pressure mercury lamp at about 3000 mj/cm$^2$ and heated at 100° C. for 1 hour and further at 150° C. for 10 hours to form an adhesive layer 2 provided with openings 7 corresponding to the photomask film and having excellent size accuracy (see FIG. 10d).

(5) The substrate 1 treated in the item (4) was immersed in an aqueous solution of 500 g/l chromic acid ($CrO_3$) as an oxidizing agent at 70° C. for 15 minutes to roughen the surface of the adhesive layer 2, which was immersed in a neutral solution (made by Shiplay) and washed with water. A paradium catalyst (made by Shiplay) was applied to the roughened adhesive layer 2 on the substrate 1 to activate the surface of the adhesive layer 2 (see FIG. 10d).

(6) The substrate 1 was heat-treated at 120° C. in an atmosphere of nitrogen gas (10 ppm oxygen) for 30 minutes for the fixation of the catalyst. Thereafter, a photosensitive dry film was laminated, exposed to a light and developed with a modified chlorocene to form a plating resist 3 (thickness 40 µm) (see FIG. 10e).

(7) Further, the substrate 1 provided with the plating resist 3 was immersed in an electroless copper plating solution having the same composition as shown in Table 1 for 11 hours to form an electroless copper plated film having a thickness of 25 µm (see FIG. 10f).

(8) The plating resist 3 was dissolved and removed with methylene chloride (see FIG. 10f).

(9) By repeating the steps of the items (3)–(8) was manufactured a build-up multilayer printed circuit board having four circuit layers (4, 6, 8, 10) (see FIG. 10g).

EXAMPLE 22

(1) An adhesive solution having a solid content of 55% was prepared by dissolving 60 parts by weight of 60% acrylated product of phenol-novolac type epoxy resin (made by Yuka Shell Co., Ltd.), 40 parts by weight of bisphenol-A type epoxy resin (made by Yuka Shell Co., Ltd.), 4 parts by weight of an imidazole curing agent (made by Shikoku Kasei Co., Ltd.), 15 parts by weight of diallyl terephthalate and 4 parts by weight of 2-methyl-1-[4-(methylthio)phenyl] -2-morpholinopropanone-1 (made by Ciba Gelgay) in butylcellosolve, mixing 100 parts by weight as a solid content of the resulting composition with 15 parts by weight of melamine resin fine powder (made by Honen Co., Ltd.) having a particle size of 0.5 µm and 30 parts by weight of the melamine resin fine powder having a particle size of 5.5 µm pulverized in a ball mill, kneading through three rolls and adding butylcellosolve. This solution had viscosities of 2.6 Pa.s at 6 rpm and 1.0 Pa.s at 60 rpm and an SVI value (thixotropy) of 2.6.

(2) The adhesive solution was applied to a polyethylene film 12 provided with a silicon coating by means of a roll coater and dried by heating at 120° C. for 30 minutes to form a sheet-shaped adhesive (see FIGS. 11a, 11b).

(3) The sheet-shaped adhesive of the item (2) was piled on the substrate 1 provided with the first circuit layer 4 in the same manner as in Example 4, and after the polyethylene film 12 was peeled off, it was pressed by heating to form an adhesive layer 2 (see FIGS. 11c, 11d, 11e).

(4) A multilayer printed circuit board was manufactured by the same method as in the items (4)–(6) of Example 4 (see FIG.

EXAMPLE 23

(1) An adhesive solution having a solid content of 50% was prepared by dissolving 50 parts by weight of 75% acrylated product of cresol-novolac type epoxy resin (made by Yuka Shell Co., Ltd.), 50 parts by weight of bisphenol-A type epoxy resin (made by Yuka Shell Co., Ltd.) and 4 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder (made by Honen Co., Ltd.) having a particle size of 0.5 µm and 30 parts by weight of the melamine resin fine powder having a particle size of 5.5 µm pulverized in a ball mill and further adding butylcellosolve acetate. The viscosity of the solution was 0.3 Pa.s at 60 rpm as measured by means of a digital viscometer at 20° C. for 60 seconds according to JIS K7117.

(2) Then, the adhesive solution was applied to a Tedolar film 12 provided with silicon coating and dried by heating at 80° C. for 30 minutes to prepare a photosensitive sheet-shaped adhesive.

(3) A build-up multilayer printed circuit board was manufactured by using the sheet-shaped adhesive in the same manner as in Example 21 (see FIG. 10).

EXAMPLE 24

This example was fundamentally the same as in Example 21 except that the adhesive solution having a solid content of 45% was obtained by dissolving 60 parts by weight of 50% acrylated product of cresol-novolac type epoxy resin (made by Yuka Shell Co., Ltd.), 40 parts by weight of bisphenol-A type epoxy resin (made by Yuka Shell Co., Ltd.), 4 parts by weight of 2-methyl-1-[4-(methylthio) phenyl]-2-morpholinopropanone-1 (made by Ciba Gelgay) and 4 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder (made by Honen Co., Ltd.) having a particle size of 0.5 µm and 30 parts by weight of the melamine resin fine powder having a particle size of 5.5 µm pulverized in a ball mill and further adding butylcellosolve acetate. The viscosity of the solution was 0.1 Pa.s at 60 rpm as measured by means of a digital viscometer at 20° C. for 60 seconds according to JIS K7117.

EXAMPLE 25

This example was fundamentally the same as in Example 21 except that the adhesive solution having a solid content of 50% was obtained by dissolving 60 parts by weight of 50% acrylated product of orthocresol-novolac type epoxy resin (made by Nihon Kayaku Co., Ltd.), 40 parts by weight of bisphenol-F type epoxy resin (made by Ydka Shell Co., Ltd.), 15 parts by weight of diallyl terephthalate, 4 parts by weight of 2-methyl-1-[4-(methylthio)phenyl]-2-morpholinopropanone-1 (made by Ciba Gelgay), 4 parts by weight of an imidazole curing agent (made by Shikoku Kasei Co., Ltd.), a photoinitiator (made by Ciba Gelgay) and 50 parts by weight of hollow melamine resin fine powder (made by Honen Co., Ltd.: particle size 2 μm) in butylcellosolve acetate, stirring in a homodisper agitator and kneading in a ball mill. The viscosity of the solution was 0.2 Pa.s at 60 rpm as measured by means of a digital viscometer at 20° C. for 60 seconds according to JIS K7117.

EXAMPLE 26

This example was fundamentally the same as in Example 21 except that the adhesive solution having a solid content of 60% was obtained by dissolving 60 parts by weight of phenol-novolac type epoxy resin (made by Yuka Shell Co., Ltd.), 40 parts by weight of difunctional acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 μm and 30 parts by weight of the melamine resin fine powder having a particle size of 5.5 μm, kneading through three rolls and further adding butylcellosolve acetate.

EXAMPLE 27

This example was fundamentally the same as in Example 21 except that the adhesive solution having a solid content of 65% was obtained by dissolving 60 parts by weight of 60% acrylated product of phenol-novolac type epoxy resin (made by Yuka Shell Co., Ltd.), 40 parts by weight of difunctional acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 μm and 30 parts by weight of the melamine resin fine powder having a particle size of 5.5 μm, kneading through three rolls and further adding butylcellosolve acetate.

EXAMPLE 28

This example was fundamentally the same as in Example 21 except that the adhesive solution having a solid content of 65% was obtained by dissolving 60 parts by weight of acrylic resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 μm and 30 parts by weight of the melamine resin fine powder having a particle size of 5.5 μm, kneading through three rolls and further adding butylcellosolve acetate.

EXAMPLE 29

This example was fundamentally the same as in Example 21 except that the adhesive solution having a solid content of 55% was obtained by dissolving 60 parts by weight of acrylic resin (made by Yuka Shell Co., Ltd.), 40 parts by weight of difunctional acrylic resin (made by Yuka Shell Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 μm and 30 parts by weight of the melamine resin fine powder having a particle size of 5.5 μm, kneading through three rolls and further adding butylcellosolve acetate.

EXAMPLE 30

This example was fundamentally the same as in Example 21 except that the adhesive solution having a solid content of 55% was obtained by dissolving 100 parts by weight of acrylic resin (made by Shin Nakamura Kagaku Co., Ltd.) and 5 parts by weight of an imidazole curing agent (made by Shikoku Kasei Co., Ltd.) in butylcellosolve acetate, mixing 100 parts by weight as a solid content of the resulting composition with 15 parts by weight of melamine resin fine powder having a particle size of 0.5 μm and 30 parts by weight of the melamine resin fine powder having a particle size of 5.5 μm, kneading through three rolls and further adding butylcellosolve acetate.

EXAMPLE 31

(1) Formalin was mixed with guanamine at a molar ratio of 1.2–1.6 to 1, adjusted to p:=6.5 and reacted at 60° C. to obtain a transparent resin liquid.

(2) The resin liquid was dried, roughly pulverized, placed in a bail mill together with phosphoric acid and plasticizer, cured and finely pulverized to obtain fine powder of guanamine resin.

(3) This example was fundamentally the same as in Example 16 except that the guanamine resin fine powder obtained in the above items (1), (2) was used as the amino resin fine powder. Moreover, the viscosity of the adhesive solution was 5.0 Pa.s at 6 rpm as measured by means of a digital viscometer at 20° C. for 60 seconds according to JIS K7117.

EXAMPLE 32

(1) An adhesive solution having a solid content of 60 % was prepared by dissolving 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) in butylcellosolve acetate to form a resin matrix composition, mixing 100 parts by weight as a solid content of the composition with 15 parts by weight of melamine resin fine powder having a particle size of 0.5 μm and 30 parts by weight of the melamine resin fine powder having a particle size of 5.5 μm, which were obtained by the same method as in the items (1)–(5) of Example 1, in a ball mill, kneading in a pearl mill and further adding methyl ethyl ketone. The viscosity of the solution was 0.05 Pa.s at 60 rpm as measured by means of a digital viscometer at 20° C. for 60 seconds according to JIS K7117.

(2) The adhesive solution was passed through an apparatus consisting of immersion, squeezing, drying and cutting to prepare a prepreg-like adhesive. That is, a galls cloth 18 was immersed in the adhesive solution 17 placed in a tank capable of being stirred under ultrasonic state, squeezed out between squeeze rolls, dried in an IR furnace 15 at 100° C.

for 10 minutes and cut to prepare a prepreg-like adhesive (see FIG. 12a).

(3) Glass epoxy prepregs were sandwiched between the prepreg-like adhesives prepared in the item (2) as an outermost layer so as to have a thickness of 1.6 mm, which was treated at 100° C. under a contact pressure for 1 minute and pressed at 100° C. under a pressure of 50 kg/cm$^2$ for 20 minutes and then cured at 150° C. for 3 hours to form an adhesive layer 2 onto a substrate 1 (see FIG. 12b).

(4) A printed circuit board was manufactured in the same manner as in the items (8)–(10) of Example 1 (see FIG. 12).

EXAMPLE 33

(1) An adhesive solution was prepared by adding methyl ethyl ketone to a mixture of 50 parts by weight of false particles prepared in the same maner as in the item (1) of Example 2, 60 parts by weight phenol-novolac type epoxy resin (made by Yuka Shell Co., Ltd.), 30 parts by weight of bisphenol-A type epoxy resin (made by Yuka Shell Co., Ltd.) and 5 parts by weight of an imidazole curing agent (made by Shikoku Kasei Co., Ltd.) so as to have a solid content of 30% and then kneading in a pearl mill. The viscosity of the solution was 0.06 Pa.s at 60 rpm.

(2) The adhesive solution 17 was impregnated into aramide fiber cloth 18 in the same manner as in Example 32 to prepare a prepreg-like adhesive.

(3) A printed circuit board was manufactured by using the prepreg-like adhesive of the item (3) in the same manner as in Example 32 (see FIG. 12).

EXAMPLE 34

(1) An adhesive solution having a solid content of 65% was prepared by adding butylcellosolve acetate to a mixture of 50 parts by weight of false particles prepared in the same manner as in the item (1) of Example 3, 60 parts by weight of phenol-novolac type epoxy resin (made by Yuka Shell Co., Ltd.), 20 parts by weight of bisphenol-A type epoxy resin (made by Yuka Shell Co., Ltd.) and 4 parts by weight of an imidazole curing agent (made by Shikoku Kasei Co., Ltd.), kneading through three rolls, stirring in a homodisper agitator and further adding butylcellosolve acetate. The viscosity of the solution was 0.04 Pa.s at 60 rpm.

(2) The adhesive solution was applied onto a glass epoxy prepreg by means of a roll coater, which was left to stand at it a horizontal state for 20 minutes and dried at 70° C. to form a prepreg-like adhesive provided with an adhesive layer 2 of 45 μm in thickness (see FIG. 13a).

(3) An adhesive layer 2 was formed on a substrate 1 by using the prepreg-like adhesive of the item (2) in the same manner as described in Example 32 (see FIG. 13b).

(4) A both-sided printed circuit board was manufactured in the same manner as in the items (40–(6) of Example 3 (see FIG. 13).

EXAMPLE 35

(1) An adhesive solution having a solid content of 55% was prepared by dissolving a mixture of 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) in methyl ethyl ketone, mixing 100 parts by weight as a solid content of the resulting composition with 15 parts by weight of melamine resin fine powder (made by Honen Co., Ltd.) having a particle size of 0.5 μm and 30 parts by weight of the melamine resin fine powder having a particle size of 5.5 μm in a ball mill and further adding methyl ethyl ketone. The viscosity of the solution was 0.05 Pa.s at 60 rpm as measured by means of a digital viscometer at 20° C. for 60 seconds according to JIS K7117.

(2) A prepreg-like adhesive was prepared by impregnating a glass cloth 18 with the adhesive solution of the above item (1) in the same manner as in the item (2) of Example 32 (see FIG. 14a).

(3) The prepreg-like adhesive of the item (2) was piled on the substrate 1 provided with a first circuit layer 4 in the same manner as in the item (1) of Example 4 and pressed by heating to form an adhesive layer 2 (see FIG. 14b).

(4) A both-sided printed circuit board was manufactured by subjecting the substrate 1 provided with the adhesive layer 2 to the same treatment as in the items (4)–(6) of Example 3 (see FIG. 14).

EXAMPLE 36

(1) An adhesive solution having a solid content of 80% was prepared by dissolving a mixture of 60 parts by weight of cresol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) in methylcellosolve, mixing 100 parts by weight as a solid content of the resulting composition with 50 parts by weight of melamine resin fine powder (made by Honen Co., Ltd.: particle size 3 μm) pulverized in a ball mill, kneading through three rolls and further adding methylcellosolve. The viscosity of the solution was 0.04 Pa.s at 60 rpm as measured by means of a digital viscometer at 20° C. for 60 seconds according to JIS K7117.

(2) The adhesive solution was applied to a glass epoxy prepreg by means of a doctor bar and then dried at 80° C. to obtain a prepreg-like adhesive provided with an adhesive layer 2 having a thickness of 50 μm.

(3) A both-sided printed circuit board was manufactured by using the prepreg-like adhesive of the above item (2) in the same manner as in Example 35.

EXAMPLE 37

This example was fundamentally the same as in Example 32 except that the adhesive solution having a solid content of 40% was obtained by dissolving 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.) in methyl ethyl ketone, mixing 100 parts by weight as a solid content of the resulting composition with 50 parts by weight of hollow melamine resin fine powder (made by Honen Co., Ltd.), kneading in a pearl mill and further adding methyl ethyl ketone. Moreover, the viscosity of the solution was 0.05 Pa.s at 60 rpm as measured by means of a digital viscometer at 20° C. for 60 seconds according to JIS K7117.

EXAMPLE 38

This example was fundamentally the same as in Example 32 except that the adhesive solution having a solid content of 55% was obtained by dissolving 60 parts by weight of phenol-novolac type epoxy resin (made by Yuka Shell Co., Ltd.), 40 parts by weight of bisphenol-A type epoxy resin (made by Yuka Shell Co., Ltd.) and 5 parts by weight of an imidazole curing agent (made by Shikoku Kasei Co., Ltd.)

in methyl ethyl ketone, mixing 100 parts by weight as a solid content of the resulting composition with 50 parts by weight of false particles prepared in the same manner as in the item (1) of Example 3, kneading in a ball mill and further adding methyl ethyl ketone. Moreover, the solution had viscosities of 0.6 Pa.s at 6 rpm and 0.5 Pa.s at 60 rpm and an SVI value (thixotropy) of 1.2.

EXAMPLE 39

(1) Urea, isothiourea and formalin were mixed at a molar ratio of 1:1:2 and cocondensed by heating at 80° C. to obtain urea-thiourea cocondensed resin fine powder.

(2) This example was fundamentally the same as in Example 32 except that the urea-thiourea cocondensed resin fine powder obtained in the item (1) was used as the amino resin fine powder. Moreover, the viscosity of the solution was 0.05 Pa.s at 6 rpm as measured by means of a digital viscometer at 20° C. for 60 seconds according to JIS K7117.

EXAMPLE 40

(1) An adhesive solution A was prepared by the same treatment as in the items (1)–(6) of Example 1 (except that the curing agent was not used).

(2) An adhesive solution B was prepared by dissolving 5 parts by weight of an imidazole curing agent in butylcellosolve.

(3) The adhesive solutions A and B were stored at room temperature for 1 month and mixed to obtain an adhesive solution. The properties of this solution were the same as in Example 1.

(4) A printed circuit board was manufactured by using the above adhesive solution in the same manner as in Example 1. The properties of the resulting board were the same as in Example 1.

EXAMPLE 41

A multilayer printed circuit board was manufactured by using the same adhesive solution as in Example 40 in the same manner as in Example 5. The properties of the resulting board were the same as in Example 5.

EXAMPLE 42

A printed circuit board was manufactured by using the same adhesive solution as in Example 40 in the same manner as in Example 32. The properties of the resulting board were the same as in Example 32.

EXAMPLE 43

This example was fundamentally the same as in Example 1 except that the adhesive solution having a solid content or 75% was obtained by dissolving 100 parts by weight of nonflammable novolac type epoxy resin (made by Nihon Kayaku Co., Ltd.) and 7 parts by weight of an imidazole curing agent (made by Shikoku Kasei Co., Ltd.) in butylcellosolve acetate, mixing 100 parts by weight as a solid content of the resulting composition with 15 parts by weight of the resin particles obtained in the items (1)–(6) of Example 1 having a particle size of 0.5 μm and 30 parts by weight of the above resin particles having a particle size of 5.5 μm, kneading through three rolls and further adding butylcellosolve acetate. Moreover, the solution had viscosities of 5.2 Pa.s at 6 rpm and 2.5 Pa.s at 60 rpm and an SVI value (thixotropy) of 2.0.

EXAMPLE 44

This example was fundamentally the same as in Example 5 except that the adhesive solution having a solid content of 75% was obtained by dissolving 100 parts by weight of nonflammable novolac type epoxy resin (made by Nihon Kayaku Co., Ltd.) and 7 parts by weight of an imidazole curing agent (made by Shikoku Kasei Co., Ltd.) in butylcellosolve acetate, mixing 100 parts by weight as a solid content of the resulting composition with 15 parts by weight of the resin particles obtained in the items (1)–(6) of Example 1 having a particle size of 0.5 μm and 30 parts by weight of the above resin particles having a particle size of 5.5 μm, kneading through three rolls and further adding butylcellosolve acetate. Moreover, the solution had viscosities of 5.2 Pa.s at 6 rpm and 2.5 Pa.s at 60 rpm and an SVI-value (thixotropy) of 2.0.

EXAMPLE 45

This example was fundamentally the same as in Example 32 except that the adhesive solution having a solid content of 75% was obtained by dissolving 100 parts by weight of nonflammable novolac type epoxy resin (made by Nihon Kayaku Co., Ltd.) and 7 parts by weight of an imidazole curing agent (made by Shikoku Kasei Co., Ltd.) in butylcellosolve acetate, mixing 100 parts by weight as a solid content of the resulting composition with 15 parts by weight of the resin particles obtained in the items (1)–(6) of Example 1 having a particle size of 0.5 μm and 30 parts by weight of the above resin particles having a particle size of 5.5 μm, kneading through three rolls and further adding butylcellosolve acetate. Moreover, the solution had viscosities of 5.2 Pa.s at 6 rpm and 2.5 Pa.s at 60 rpm and an SVI value (thixotropy) of 2.0.

In the above examples, the epoxy resin was used as a matrix because the epoxy resin hardly soluble in the acid or oxidizing agent was large in the crosslinking density and the ionic compound hardly moved to cause no migration.

Comparative Example 1

A printed circuit board was produced in the same manner as in Example 1 except that an epoxy resin cured by a dicyano series curing agent was used as a heat-resistant resin fine powder.

Comparative Example 2

A printed circuit board was produced in the same manner as in Example 4 except that an epoxy resin cured by a dicyano series curing agent was used as a heat-resistant resin fine powder.

Comparative Example 3

A printed circuit board was produced in the same manner as in Example 14 except that an epoxy resin cured by anhydrous pyromellitic acid was used as a heat-resistant resin fine powder.

Comparative Example 4

A printed circuit board was produced in the same manner as in Example 27 except that an epoxy resin cured by anhydrous trimellitic acid was used as a heat-resistant resin fine powder.

The adhesion property (peeling strength), electric property (electrical insulating quality), hardness (Barcol viscosity) and influence of impurity (resistance to migration) of the electroless plated film in the printed circuit board and the solubility of the amino resin fine powder in acid or oxidizing agent were measured to obtain results as shown in Table 2.

TABLE 2

|  |  | Peeling strength (kg/cm) | Electrical insulating quality | Hardness | Impurity influence | Solubility of melamine |
|---|---|---|---|---|---|---|
| Example | 1 | 1.9 | O | 60 | O | 300 |
|  | 2 | 1.8 | O | 50 | O | 350 |
|  | 3 | 1.8 | O | 60 | O | 250 |
|  | 4 | 1.9 | O | 55 | O | 220 |
|  | 5 | 1.8 | O | 52 | O | 300 |
|  | 6 | 1.8 | O | 61 | O | 310 |
|  | 7 | 1.8 | O | 60 | O | 310 |
|  | 8 | 1.9 | O | 61 | O | 290 |
|  | 9 | 1.8 | O | 61 | O | 290 |
|  | 10 | 1.8 | O | 62 | O | 300 |
|  | 11 | #.8 | O | 60 | O | 300 |
|  | 12 | 1.9 | O | 61 | O | 300 |
|  | 13 | 1.8 | O | 61 | O | 290 |
|  | 14 | 1.9 | O | 60 | O | 310 |
|  | 15 | 1.8 | O | 60 | O | 300 |
|  | 16 | 2.2 | O | 61 | O | 301 |
|  | 17 | 1.9 | O | 65 | O | 200 |
|  | 18 | 2.0 | O | 62 | O | 300 |
|  | 19 | 2.1 | O | 60 | O | 300 |
|  | 20 | 2.0 | O | 60 | O | 310 |
|  | 21 | 2.1 | O | 61 | O | 310 |
|  | 22 | 1.9 | O | 63 | O | 255 |
|  | 23 | 2.1 | O | 60 | O | 300 |
| Example | 24 | 2.1 | O | 62 | O | 310 |
|  | 25 | 2.0 | O | 60 | O | 300 |
|  | 26 | 2.0 | O | 60 | O | 310 |
|  | 27 | 2.1 | O | 61 | O | 310 |
|  | 28 | 1.8 | O | 62 | O | 310 |
|  | 29 | 1.9 | O | 60 | O | 310 |
|  | 30 | 1.9 | O | 60 | O | 300 |
|  | 31 | 2.0 | O |  | O |  |
|  | 32 | 1.8 | O | 61 | O | 301 |
|  | 33 | 1.8 | O | 55 | O | 355 |
|  | 34 | 1.9 | O | 58 | O | 300 |
|  | 35 | 1.9 | O | 57 | O | 220 |
|  | 36 | 1.9 | O | 55 | O | 300 |
|  | 37 | 1.7 | O | 60 | O | 340 |
|  | 38 | 1.9 | O | 55 | O | 230 |
|  | 39 | 2.0 | O | 61 | O | 300 |
|  | 40 | 1.9 | O | 60 | O | 300 |
|  | 41 | 1.8 | O | 65 | O | 300 |
|  | 42 | 1.8 | O | 65 | O | 200 |
|  | 43 | 1.9 | O | 60 | O | 300 |
|  | 44 | 1.8 | O | 65 | O | 300 |
|  | 45 | 1.8 | O | 60 | O | 305 |
| Comparative Example | 1 | 1.5 | X | 35 | X | 10 |
|  | 2 | 0.1 | X | 35 | X | 10 |
|  | 3 | 1.5 | X | 35 | X | 10 |
|  | 4 | 0.1 | X | 35 | X | 10 |

As seen from Table 2, the amino resin fine powder used in the invention is excellent in the solubility in the acid or oxidizing agent as compared with the epoxy resin fine powder used in the comparative examples and shows a high peeling strength. Furthermore, the migration reaction is not observed in the invention.

Thus, according to the invention, not only the high adhesion strength of the conductor is obtained, but also the insulation reliability between the conductors is excellent, which are advantageous in the manufacture of high density printed circuit board. Moreover, the surface hardness is high and the wire bonding property is excellent, so that the printed circuit board according to the invention can advantageously be used as a substrate for mounting bear chip.

The surface resistivity in the adhesive-layer is unchangeable as compared with the initial value even after the adhesive layer is immersed in a boiling water of 100° C. for 2 hours. Further, there is observed no abnormal change even after the circuit board is closed to a hot plate of 300° C. and held at this temperature for 10 minutes.

Moreover, the each test method for the adhesion strength (peeling strength), electrical insulating quality, hardness and impurity influence of the electroless plated film is described below.

(1) Adhesion strength (peeling strength

It was measured according to a method of JIS C-6481.

(2) Electrical insulating quality

A direct current or a sine curve alternating current of a frequency of 50 Hz or 60 Hz was applied at a peak voltage of 500 V to a comb type pattern of L/S=100/100 μm formed on the printed circuit board. The voltage was gradually raised to a given value in about 5 seconds and charged for 1 minutes, during which mechanical damage, flush over and insulation breakage (when passing a current of not less than 0.5 mA) were measured.

(3) Hardness (Barcol hardness)

Device: system A indication value of aluminum alloy standard piece: 85–87 (hard), 43–48 (soft)

Model: GYZJ934-1

Adjustment: hardness was adjusted to a value of 100±1 by using a glass plate and then to the indication value by using the aluminum alloy standard piece.

Operation: an indenting tool of a hardness testing machine was vertically pushed to a surface of a sample to read a maximum value. The measuring position is a smooth surface located inward from the sample end to not less than 3 mm and separated apart from a recess to not less than 3 mm.

Measurement: hardness was measured by heating the substrate at 150° C. and holding this temperature for 5 minutes.

(4) Impurity influence (resistance to migration)

Test piece: printed circuit board having a comb pattern of L/S=50/50 μm

Measurement: the board was placed in a thermo-hygrostat at a temperature of 85°±1° C. and a relative humidity of 85–90% and left to stand while applying a voltage of 30 V. The presence or absence of migration was measured after 1000 hours.

What is claimed is:

1. A prepreg adhesive obtained by forming an adhesive by dispersing a cured fine powder of amino resin which is soluble in an acid or an oxidizing agent into an uncured heat-resistant resin matrix, said uncured heat-resistant resin matrix being curable into a heat-resistant resin matrix which is hardly soluble in the acid or the oxidizing agent, impregnating a fibrous substrate with the adhesive, and removing the cured fine powder with the acid or the oxidizing agent to form a roughened surface for the formation of a conductor pattern through electroless plating.

2. The adhesive according to claim 1, wherein said amino resin fine powder is dispersed into said heat-resistant resin matrix in an amount of 10–100 parts by weight per 100 parts by weight as a solid content of said matrix.

3. The adhesive according to claim 1, wherein said amino resin fine powder is at least one member selected from the group consisting of melamine resin, urea resin, and guanamine resin.

4. The adhesive according to claim 1, wherein said uncured heat-resistant resin matrix is a thermosetting heat-resistant resin or a photosensitive heat-resistant resin.

5. The adhesive according to claim 1, wherein said uncured heat-resistant resin matrix comprises an uncured polyfunctional epoxy resin and an imidazole curing agent.

6. The adhesive according to claim 5, wherein said uncured heat-resistant resin matrix comprises a mixture of a thermosetting heat-resistant resin comprised of said uncured polyfunctional epoxy resin and 2–10 wt % as a solid content of said imidazole curing agent.

7. The adhesive according to claim 1, wherein said uncured heat-resistant resin matrix comprises at least one photosensitive heat resistant resin selected from the group consisting of an uncured polyfunctional epoxy resin and an uncured polyfunctional resin containing an acryl group.

8. A method of forming a prepreg adhesive for the formation of a conductor pattern through electroless plating on a roughened surface comprising:

forming an adhesive by dispersing a cured fine powder of amino resin which is soluble in an acid or an oxidizing agent into an uncured heat-resistant resin matrix, said uncured heat-resistant resin matrix being curable into a heat-resistant resin matrix which is hardly soluble in the acid or the oxidizing agent; and impregnating a fibrous substrate with the adhesive.

9. The method according to claim 8, wherein said amino resin fine powder is dispersed into said heat-resistant resin matrix in an amount of 10–100 parts by weight per 100 parts by weight as a solid content of said matrix.

10. The method according to claim 8, wherein said amino resin fine powder is at least one member selected from the group consisting of melamine resin, urea resin, and guanamine resin.

11. The method according to claim 8, wherein said uncured heat-resistant resin matrix is a thermosetting heat-resistant resin or a photosensitive heat-resistant resin.

12. The method according to claim 8, wherein said uncured heat-resistant resin matrix comprises an uncured polyfunctional epoxy resin and an imidazole curing agent.

13. The method according to claim 12, wherein said uncured heat-resistant resin matrix comprises a mixture of a thermosetting heat-resistant resin comprised of said uncured polyfunctional epoxy resin and 2–10 wt % as a solid content of said imidazole curing agent.

14. The method according to claim 8, wherein said uncured heat-resistant resin matrix comprises at least one photosensitive heat resistant resin selected from the group consisting of an uncured polyfunctional epoxy resin and an uncured polyfunctional resin containing an acryl group.

* * * * *